(12) United States Patent
Anno et al.

(10) Patent No.: US 8,669,042 B2
(45) Date of Patent: Mar. 11, 2014

(54) RESIST PATTERN-FORMING METHOD

(75) Inventors: Yusuke Anno, Tokyo (JP); Takashi Mori, Tokyo (JP); Hirokazu Sakakibara, Tokyo (JP); Taiichi Furukawa, Tokyo (JP); Kazunori Takanashi, Tokyo (JP); Hiromitsu Tanaka, Tokyo (JP); Shin-ya Minegishi, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/434,851

(22) Filed: Mar. 30, 2012

(65) Prior Publication Data

US 2012/0183908 A1    Jul. 19, 2012

Related U.S. Application Data

(63) Continuation of application No. PCT/JP2011/069957, filed on Sep. 1, 2011.

(30) Foreign Application Priority Data

Sep. 9, 2010   (JP) .................................. 2010-202361
Aug. 22, 2011  (JP) .................................. 2011-181004

(51) Int. Cl.
    *G03F 7/26*         (2006.01)
(52) U.S. Cl.
    USPC ....................................................... 430/325
(58) Field of Classification Search
    USPC ................................................ 430/322, 325
    See application file for complete search history.

(56) References Cited

U.S. PATENT DOCUMENTS

| 2007/0105363 | A1* | 5/2007 | Babich et al. ................. 438/618 |
| 2008/0076059 | A1* | 3/2008 | Abdallah et al. ........... 430/270.1 |
| 2008/0187860 | A1* | 8/2008 | Tsubaki et al. ............ 430/270.1 |

FOREIGN PATENT DOCUMENTS

| JP | 06-012452 | 5/1984 |
| JP | 59-093448 | 5/1984 |
| JP | 05-188598 | 7/1993 |
| JP | 2000-199953 | 7/2000 |
| JP | 2005-352384 | 12/2005 |
| JP | 2007-279135 | 10/2007 |
| JP | 2008-309878 | 12/2008 |
| JP | 2008-309879 | 12/2008 |
| JP | 2009-237363 | 10/2009 |
| WO | WO 2012/039337 | 3/2012 |

OTHER PUBLICATIONS

Japanese Office Action for corresponding JP Application No. 2011-181004, Apr. 17, 2012.
International Search Report for corresponding International Application No. PCT/JP2011/069957, Oct. 11, 2011.
Written Opinion for corresponding International Application No. PCT/JP2011/069957, Oct. 11, 2011.

* cited by examiner

*Primary Examiner* — Brittany Raymond
(74) *Attorney, Agent, or Firm* — Ditthavong Mori & Steiner, P.C.

(57) ABSTRACT

A resist pattern-forming method includes applying a resist underlayer film-forming composition to a substrate to form a resist underlayer film. The resist underlayer film-forming composition includes (A) a polysiloxane. A radiation-sensitive resin composition is applied to the resist underlayer film to form a resist film. The radiation-sensitive resin composition includes (a1) a polymer that changes in polarity and decreases in solubility in an organic solvent due to an acid. The resist film is exposed. The exposed resist film is developed using a developer that includes an organic solvent.

9 Claims, No Drawings

RESIST PATTERN-FORMING METHOD

CROSS-REFERENCE TO RELATED APPLICATIONS

The present application is a continuation application of International Application No. PCT/JP2011/069957, filed Sep. 1, 2011, which claims priority to Japanese Patent Application No. 2010-202361, filed Sep. 9, 2010 and to Japanese Patent Application No. 2011-181004, filed Aug. 22, 2011. The contents of these applications are incorporated herein by reference in their entirety.

BACKGROUND OF THE INVENTION

1. Field of the Invention

The invention relates to a resist pattern-forming method.

2. Discussion of the Background

A reduction in the line width of a resist pattern used for lithography has been desired along with miniaturization of the structure of electronic devices (e.g., semiconductor devices and liquid crystal devices). A fine resist pattern having a line width of about 90 nm can be formed using short-wavelength radiation (e.g., ArF excimer laser light) and a radiation-sensitive resin composition that responds to such short-wavelength radiation. However, it will be required to form a finer resist pattern in the future.

As technology that makes it possible to form a finer pattern by utilizing the characteristics of the radiation-sensitive resin composition, technology that utilizes an organic solvent having a polarity lower than that of an alkaline aqueous solution as the developer has been proposed (see Japanese Patent Application Publication (KOKAI) No. 2000-199953). This technology makes it possible to increase the optical contrast, so that a finer pattern can be formed.

However, it will be required to form a resist pattern in a finer area in the future. A resist pattern-forming method that can deal with various resist patterns such as a trench pattern (e.g., line-and-space pattern) and a hole pattern (e.g., contact hole pattern), and can form a resist pattern that exhibits an excellent depth of focus and an excellent pattern shape, and also exhibits excellent critical dimension uniformity (CDU) (when forming a hole pattern) or excellent pattern collapse resistance (when forming a trench pattern), has been desired.

SUMMARY OF THE INVENTION

According to one aspect of the present invention, a resist pattern-forming method includes applying a resist underlayer film-forming composition to a substrate to form a resist underlayer film. The resist underlayer film-forming composition includes (A) a polysiloxane. A radiation-sensitive resin composition is applied to the resist underlayer film to form a resist film. The radiation-sensitive resin composition includes (a1) a polymer that changes in polarity and decreases in solubility in an organic solvent due to an acid. The resist film is exposed. The exposed resist film is developed using a developer that includes an organic solvent.

DESCRIPTION OF THE EMBODIMENTS

According to an embodiment of the invention, a resist pattern-forming method includes:
(1) applying a resist underlayer film-forming composition to a substrate to form a resist underlayer film, the resist underlayer film-forming composition including (A) a polysiloxane;
(2) applying a radiation-sensitive resin composition to the resist underlayer film to form a resist film, the radiation-sensitive resin composition including (a1) a polymer that changes in polarity and decreases in solubility in an organic solvent due to an acid (hereinafter may be referred to as "polymer (a1)");
(3) exposing the resist film; and
(4) developing the exposed resist film using a developer that includes an organic solvent.

The resist pattern-forming method can deal with various resist patterns, and can form a resist pattern that exhibits an excellent depth of focus, an excellent pattern shape, high resolution, excellent CDU, and excellent pattern collapse resistance, by forming the resist underlayer film that includes the polysiloxane (A), and developing the resist film using the developer that includes an organic solvent. The reasons that the above effects are achieved by the above configuration have not necessarily been clarified. It is conjectured that the polysiloxane (A) included in the resist underlayer film strongly interacts with the resist pattern formed on the resist underlayer film, so that excellent pattern collapse resistance is achieved. It is also conjectured that a wide depth of focus is achieved, and the pattern shape, the CDU, and the resolution are improved due to an improvement in pattern collapse resistance.

The resist underlayer film-forming composition may further include (B) a nitrogen-containing compound.

It is conjectured that the nitrogen-containing compound (B) present in the resist underlayer film formed under the resist pattern promotes a crosslinking reaction within the underlayer film, so that the oxygen ashing resistance is improved.

The resist underlayer film-forming composition may further include (C) a photoacid generator (hereinafter may be referred to as "acid generator (C)").

It is conjectured that dissociation of the acid-labile group included in the polymer within the resist pattern formed on the resist underlayer film is promoted when the resist underlayer film includes the acid generator (C), so that the resolution, the pattern collapse resistance, and the like are further improved.

The polymer (a1) preferably includes a structural unit (I) shown by the following formula (1).

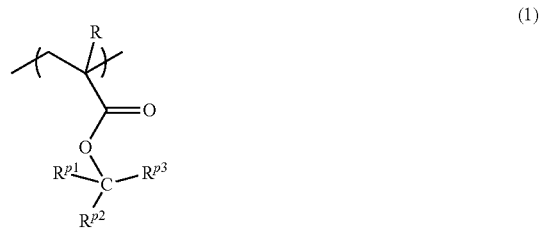

wherein R represents a hydrogen atom or a methyl group, and $R^{p1}$, $R^{p2}$, and $R^{p3}$ individually represent a monovalent hydrocarbon group having 1 to 20 carbon atoms, and $R^{p2}$ and $R^{p3}$ may bond to each other to form a divalent alicyclic hydrocarbon group having 4 to 20 carbon atoms together with the carbon atom bonded to $R^{p2}$ and $R^{p3}$.

When the polymer (a1) included in the radiation-sensitive resin composition includes the above specific structural unit, the resist pattern formed using the radiation-sensitive resin composition includes a carboxyl group, so that interaction with the polysiloxane (A) included in the resist underlayer film is considered to increase. This further improves the properties of the resist pattern.

The radiation-sensitive resin composition preferably further includes (a2) a polymer that includes at least one structural unit (III) selected from the group consisting of a structural unit shown by a formula (3-1) and a structural unit shown by a formula (3-2) (hereinafter may be referred to as "polymer (a2)").

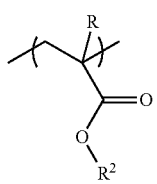

(3-1)

wherein $R^1$ represents a hydrogen atom, a methyl group, or a trifluoromethyl group, and $R^2$ represents a linear or branched alkyl group having 1 to 6 carbon atoms that includes a fluorine atom, or a monovalent alicyclic group having 4 to 20 carbon atoms that includes a fluorine atom, wherein a part or all of the hydrogen atoms of the alkyl group or the alicyclic hydrocarbon group may be substituted with a substituent.

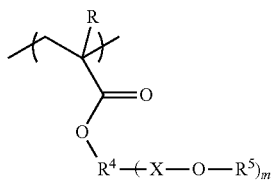

(3-2)

wherein $R^3$ represents a hydrogen atom, a methyl group, or a trifluoromethyl group, $R^4$ represents an (m+1)-valent linking group, m is an integer from 1 to 3, X represents a divalent linking group that includes a fluorine atom, and $R^5$ represents a hydrogen atom or a monovalent organic group, and wherein a plurality of X and a plurality of $R^5$ may respectively be either identical or different when m is 2 or 3.

When the radiation-sensitive resin composition includes the polymer (a2) that includes the above specific structural unit that includes a fluorine atom, the polymer (a2) is unevenly distributed in the surface layer of the resulting resist film, so that elution of the acid generator and the like from the resist film into the immersion liquid can be suppressed during liquid immersion lithography. Moreover, it is possible to implement a higher speed scan due to an increase in the hydrophobicity of the surface of the resist film.

It is preferable that the polymer (a2) does not include an acid-labile group. When the polymer (a2) does not include an acid-labile group, the effect of suppressing elution of the acid generator and the like during liquid immersion lithography can be improved while improving the hydrophobicity of the surface of the resist film. Moreover, occurrence of development defects due to insufficient dissolution can be suppressed even if the polymer (a2) does not include an acid-labile group when implementing the resist pattern-forming method that utilizes the organic solvent as the developer.

The polysiloxane (A) is preferably a hydrolysis-condensation product of a silane compound shown by the following formula (i).

$$R^A{}_a SiX_{4-a}$$ (i)

wherein $R^A$ represents a hydrogen atom, a fluorine atom, an alkyl group having 1 to 5 carbon atoms, an alkenyl group, an aryl group, or a cyano group, a part or all of the hydrogen atoms of the alkyl group may be substituted with a glycidyloxy group, an oxetanyl group, an acid anhydride group, or a cyano group, and a part or all of the hydrogen atoms of the aryl group may be substituted with a hydroxyl group, X represents a halogen atom or —$OR^B$, $R^B$ represents a monovalent organic group, a is an integer from 0 to 3, and a plurality of $R^A$ and a plurality of X may respectively be either identical or different when a plurality of $R^A$ and a plurality of X are present.

When the polysiloxane (A) is a hydrolysis-condensation product of the above specific silane compound, interaction between the resist underlayer film and the resist pattern formed on the resist underlayer film can be improved, so that the resolution, the pattern collapse resistance, and the like of the resist pattern can be further improved.

It is preferable that the resist pattern-forming method be used to form at least one pattern selected from the group consisting of a trench pattern and a hole pattern. Since a pattern that exhibits excellent resolution and CDU can be formed by the resist pattern-forming method, the resist pattern-forming method is particularly suitable for forming a hole pattern (e.g., contact hole pattern). Since a pattern that exhibits excellent pattern collapse resistance can be formed by the resist pattern-forming method, the resist pattern-forming method is particularly suitable for forming a trench pattern (e.g., line-and-space pattern).

The resist pattern-forming method thus can deal with various resist patterns, and can form a resist pattern that exhibits an excellent depth of focus, an excellent pattern shape, high resolution, excellent CDU, and excellent pattern collapse resistance.

Resist Pattern-Forming Method

A resist pattern-forming method according to one embodiment of the invention includes (1) applying a resist underlayer film-forming composition to a substrate to form a resist underlayer film, the resist underlayer film-forming composition including (A) a polysiloxane (hereinafter may be referred to as "step (1)"), (2) applying a radiation-sensitive resin composition to the resist underlayer film to form a resist film, the radiation-sensitive resin composition including (a1) a polymer that changes in polarity and decreases in solubility in an organic solvent due to an acid (hereinafter may be referred to as "step (2)"), (3) exposing the resist film (hereinafter may be referred to as "step (3)"), and (4) developing the exposed resist film using a developer that includes an organic solvent (hereinafter may be referred to as "step (4)"). Each step is described in detail below.

Step (1)

In the step (1), the resist underlayer film-forming composition that includes the polysiloxane (A) is applied to a substrate to form a resist underlayer film. The resist underlayer film-forming composition is described later. A silicon wafer, an aluminum-coated wafer, or the like may be used as the substrate. An organic antireflective film as disclosed in Japanese Patent Publication (KOKOKU) No. 6-12452, Japanese Patent Application Publication (KOKAI) No. 59-93448, or the like may be formed on the substrate.

The resist underlayer film-forming composition may be applied by spin coating, cast coating, roll coating, or the like. The thickness of the resist film is normally 0.01 to 1 μm, and preferably 0.01 to 0.5 μm.

The resist underlayer film formed by applying the resist underlayer film-forming composition may optionally be pre-baked (PB) to vaporize the solvent. The PB temperature is appropriately selected depending on the composition of the resist underlayer film-forming composition, but is normally about 50 to about 450° C. The PB time is normally about 5 to about 600 seconds.

Step (2)

In the step (2), the radiation-sensitive resin composition is applied to the resist underlayer film formed by the step (1) to form a resist film, the radiation-sensitive resin composition including the polymer (a1) that changes in polarity and decreases in solubility in an organic solvent due to an acid. The radiation-sensitive resin composition is described later. The radiation-sensitive resin composition may be applied in the same manner (i.e., coating method and thickness) as the resist underlayer film-forming composition used in the step (1). The PB temperature is appropriately selected depending on the composition of the radiation-sensitive resin composition, but is normally about 30 to about 200° C., and preferably 50 to 150° C. The PB time is normally about 5 to about 600 seconds.

A protective film as disclosed in Japanese Patent Application Publication (KOKAI) No. 5-188598 or the like may be formed on the resist film so that the resist film is not affected by basic impurities and the like contained in the environmental atmosphere. In order to prevent outflow of the acid generator and the like from the resist film, a liquid immersion lithography protective film as disclosed in Japanese Patent Application Publication (KOKAI) No. 2005-352384 or the like may be formed on the resist film. These techniques may be used in combination.

Step (3)

In the step (3), the desired area of the resist film formed by the step (2) is exposed through a mask having a specific pattern and an optional immersion liquid. The resist film may be successively exposed a plurality of times. For example, the desired area of the resist film may be subjected to a first exposure through a mask, and then subjected to a second exposure so that the exposed areas intersect. For example, when the exposed areas intersect perpendicularly, it is easy to form a circular contact hole pattern in the unexposed area enclosed by the exposed areas. Examples of the immersion liquid that is optionally used for exposure include water, a fluorine-containing inert liquid, and the like. It is preferable that the immersion liquid be transparent to the exposure wavelength, and have a refractive index temperature coefficient as small as possible so that distortion of an optical image projected onto the resist film is minimized. When using an ArF excimer laser (wavelength: 193 nm) as the exposure light source, it is preferable to use water from the viewpoint of availability and ease of handling. When using water as the immersion liquid, a small amount of an additive that decreases the surface tension of water and increases the surface activity of water may be added to the water. It is preferable that the additive does not dissolve the resist layer formed on the wafer, and does not affect the bottom optical coating of the lens. Distilled water is preferably used as the water.

Examples of radiation used for exposure include electromagnetic waves such as ultraviolet rays, deep ultraviolet rays, X-rays, and γ-rays, charged particle rays such as electron beams and α-rays, and the like. Among these, deep ultraviolet rays are preferable. It is more preferable to use ArF excimer laser light or KrF excimer laser light (wavelength: 248 nm). It is still more preferable to use ArF excimer laser light. The exposure conditions (e.g., dose) are appropriately selected depending on the composition of the radiation-sensitive resin composition, the type of additive, and the like. When the resist pattern-forming method includes a plurality of exposure steps, an identical or different light source may be used in each exposure step. Note that it is preferable to use ArF excimer laser light in the first exposure step.

It is preferable to perform post-exposure bake (PEB) after exposure. The acid-labile group included in the polymer included in the radiation-sensitive resin composition dissociates smoothly due to PEB, for example. The PEB temperature is normally 30 to 200° C., and preferably 50 to 170° C. The PEB time is normally 5 to 600 seconds.

Step (4)

In the step (4), the resist film exposed in the step (3) is developed using the developer that includes the organic solvent to form a pattern. Specifically, the unexposed area and the low-exposed area are selectively dissolved and removed using the developer that includes the organic solvent. It is preferable that the developer include the organic solvent as the main component. The content of the organic solvent in the developer is preferably 60 mass % or more, more preferably 70 mass % or more, still more preferably 80 mass % or more, and particularly preferably 90 mass % or more. The organic solvent included in the developer is preferably at least one solvent selected from the group consisting of alcohol solvents, ether solvents, ketone solvents, amide solvents, ester solvents, and hydrocarbon solvents.

Examples of the alcohol solvents include monohydric alcohol solvents such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethyl butyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropyleneglycol monomethylether, dipropylene glycol monoethyl ether, and dipropylene glycol monopropyl ether; and the like.

Examples of the ether solvents include dialiphatic ether solvents such as diethyl ether, ethyl propyl ether, dipropyl ether, dibutyl ether, and diisopropyl ether;

aromatic ring-containing ether solvents such as anisole, phenyl ethyl ether, phenyl propyl ether, tolyl methyl ether, tolyl ethyl ether, diphenyl ether, and ditolyl ether;

cyclic ether solvents such as tetrahydrofuran, tetrahydropyran, and methyltetrahydrofran; and the like.

Examples of the ketone solvents include chain-like ketone solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, and trimethylenonane;

cyclic ketone solvents such as cyclopentanone, cycloheptanone, cyclooctanone, and methylcyclohexanone;
diketone solvents such as 2,4-pentanedione and acetonylacetone;
hydroxyl group-containing ketone solvents such as diacetone alcohol;
aromatic ketone solvents such as acetophenone and phenyl ethyl ketone; and the like.

Examples of the amide solvents include N,N'-dimethylimidazolidinone, N-methylformamide, N,N-dimethylformamide, N,N-diethylformamide, acetamide, N-methylacetamide, N,N-dimethylacetamide, N-methylpropioneamide, N-methylpyrrolidone, and the like.

Examples of the ester solvents include carboxylate solvents such as methyl acetate, ethyl acetate, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, glycol diacetate, methoxy triglycol acetate, methyl acetoacetate, ethyl acetoacetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate;
polyhydric alcohol monoalkyl ether acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, and dipropylene glycol monoethyl ether acetate;
carbonate solvents such as diethyl carbonate and propylene carbonate;
lactone solvents such as γ-butyrolactone and γ-valerolactone; and the like.

Examples of the hydrocarbon solvents include aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane;
aromatic hydrocarbon solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene;
halogen-containing solvents such as dichloromethane, chloroform, fluorocarbon, chlorobenzene, and dichlorobenzene; and the like.

Among these, alcohol solvents, ether solvents, ketone solvents, and ester solvents are preferable, ether solvents, ketone solvents, and ester solvents are more preferable, and aromatic ring-containing ether solvents, chain-like ketone solvents, and carboxylate solvents are still more preferable. It is particularly preferable to use n-butyl acetate, isopropyl acetate, n-butyl acetate, amyl acetate, methyl n-pentyl ketone, or anisole. These organic solvents may be used either individually or in combination.

An appropriate amount of surfactant may optionally be added to the developer. An ionic or nonionic fluorine-containing surfactant and/or a silicone surfactant or the like may be used as the surfactant.

Examples of the development method include a dipping method that immerses the substrate in a container filled with the developer for a given time, a puddle method that allows the developer to be present on the surface of the substrate due to surface tension for a given time, a spray method that sprays the developer onto the surface of the substrate, a dynamic dispensing method that applies the developer to the substrate that is rotated at a constant speed while scanning with a developer application nozzle at a constant speed, and the like.

The resist film developed in the step (4) may be rinsed with a rinse agent. An alkane solvent, a ketone solvent, an ester solvent, an alcohol solvent, an amide solvent, and the like are preferable as the rinse agent. Among these, an alcohol solvent and an ester solvent are preferable, and a monohydric alcohol solvent having 6 to 8 carbon atoms is particularly preferable. Examples of the monohydric alcohol solvent having 6 to 8 carbon atoms include linear, branched, or cyclic monohydric alcohols such as 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, and benzyl alcohol. Among these, 1-hexanol, 2-hexanol, 2-heptanol, and 4-methyl-2-pentanol are preferable, and 4-methyl-2-pentanol is more preferable.

The rinse agent may include one or more types of each component. The water content in the rinse agent is preferably 10 mass % or less, more preferably 5 mass % or less, and particularly preferably 3 mass % or less. If the water content in the rinse agent is 10 mass % or less, excellent developability can be obtained. Note that a surfactant (described later) may be added to the rinse agent.

Examples of the rinse method include a spin method that applies the rinse agent to the substrate that is rotated at a constant speed, a dipping method that immerses the substrate in a container filled with the rinse agent for a given time, a spray method that sprays the rinse agent onto the surface of the substrate, and the like.

Resist Underlayer Film-Forming Composition

The resist underlayer film-forming composition includes the polysiloxane (A). The resist underlayer film-forming composition preferably further includes (B) a nitrogen-containing compound, (C) an acid generator, and (D) a solvent. The resist underlayer film-forming composition may further include an additional optional component as long as the effects of the invention are not impaired. Each component is described below.

Polysiloxane (A)

The polysiloxane (A) is not particularly limited as long as the polysiloxane (A) is a polymer that includes a siloxane bond, but is preferably a hydrolysis-condensation product of the silane compound shown by the formula (i). The polysiloxane (A) may be synthesized using only one type of silane compound, or may be synthesized using two or more types of silane compound.

In the formula (i), $R^A$ represents a hydrogen atom, a fluorine atom, an alkyl group having 1 to 5 carbon atoms, an alkenyl group, an aryl group, or a cyano group, a part or all of the hydrogen atoms of the alkyl group may be substituted with a glycidyloxy group, an oxetanyl group, an acid anhydride group, or a cyano group, and a part or all of the hydrogen atoms of the aryl group may be substituted with a hydroxyl group, X represents a halogen atom or —$OR^B$, $R^B$ represents a monovalent organic group, a is an integer from 0 to 3, and a plurality of $R^A$ and a plurality of X may respectively be either identical or different when a plurality of $R^A$ and a plurality of X are present.

Examples of the alkyl group having 1 to 5 carbon atoms represented by $R^A$ include linear alkyl groups such as a methyl group, an ethyl group, an n-propyl group, an n-butyl group, and an n-pentyl group; branched alkyl groups such as an isopropyl group, an isobutyl group, a sec-butyl group, a t-butyl group, and an isoamyl group; and the like.

Examples of the alkenyl group represented by $R^A$ include a group obtained by removing one hydrogen atom from an alkene compound, and the like. Specific examples of the alkenyl group include an ethenyl group, a 1-propen-1-yl group, a 1-propen-2-yl group, a 1-propen-3-yl group, a 1-buten-1-yl group, a 1-buten-2-yl group, a 1-buten-3-yl group, a 1-buten-4-yl group, a 2-buten-1-yl group, a 2-buten-2-yl group, a 1-penten-5-yl group, a 2-penten-1-yl group, a 2-penten-2-yl group, a 1-hexen-6-yl group, a 2-hexen-1-yl group, a 2-hexen-2-yl group, and the like. Among these, a group shown by the following formula (i-1) is preferable.

$$CH_2=CH-(CH_2)_n-* \quad (i\text{-}1)$$

wherein n is an integer from 0 to 4, and "*" indicates a bonding site.

n is preferably 0 or 1, and more preferably 0 (i.e., vinyl group).

Examples of the aryl group represented by $R^A$ include a phenyl group, a naphthyl group, a methylphenyl group, an ethylphenyl group, a chlorophenyl group, a bromophenyl group, a fluorophenyl group, and the like.

Examples of the acid anhydride group that may substitute the alkyl group include a succinic anhydride group, a maleic anhydride group, a glutaric anhydride group, and the like.

Examples of the alkyl group substituted with a glycidyloxy group include a 2-glycidyloxyethyl group, a 3-glycidyloxypropyl group, a 4-glycidyloxybutyl group, and the like. Among these, a 3-glycidyloxypropyl group is preferable.

Examples of the alkyl group substituted with an oxetanyl group include a 3-ethyl-3-oxetanylpropyl group, a 3-methyl-3-oxetanylpropyl group, a 3-ethyl-2-oxetanylpropyl group, a 2-oxetanylethyl group, and the like. Among these, a 3-ethyl-3-oxetanylpropyl group is preferable.

Examples of the alkyl group substituted with an acid anhydride group include a 2-succinic anhydride group-substituted ethyl group, a 3-succinic anhydride group-substituted propyl group, a 4-succinic anhydride group-substituted butyl group, and the like. Among these, a 3-succinic anhydride group-substituted propyl group is preferable.

Examples of the alkyl group substituted with a cyano group include a 2-cyanoethyl group, a 3-cyanopropyl group, a 4-cyanobutyl group, and the like.

Examples of the aryl group substituted with a hydroxyl group include a 4-hydroxyphenyl group, a 4-hydroxy-2-methylphenyl group, a 4-hydroxynaphthyl group, and the like. Among these, a 4-hydroxyphenyl group is preferable.

Examples of the halogen atom represented by X include a fluorine atom, a chlorine atom, a bromine atom, an iodine atom, and the like.

Examples of the monovalent organic group represented by $R^B$ include an alkyl group, an alkylcarbonyl group, and the like. A methyl group, an ethyl group, an n-propyl group, an isopropyl group, an n-butyl group, an isobutyl group, a sec-butyl group, and a t-butyl group are preferable as the alkyl group. A methylcarbonyl group and an ethylcarbonyl group are preferable as the alkylcarbonyl group.

a is preferably an integer from 0 to 2, and more preferably 1 or 2.

Specific examples of the silane compound shown by the formula (i) include aromatic ring-containing trialkoxysilanes such as phenyltrimethoxysilane, benzyltrimethoxysilane, phenethyltrimethoxysilane, 4-methylphenyltrimethoxysilane, 4-ethylphenyltrimethoxysilane, 4-methoxyphenyltrimethoxysilane, 4-phenoxyphenyltrimethoxysilane, 4-hydroxyphenyltrimethoxysilane, 4-aminophenyltrimethoxysilane, 4-dimethylaminophenyltrimethoxysilane, 4-acetylaminophenyltrimethoxysilane, 3-methylphenyltrimethoxysilane, 3-ethylphenyltrimethoxysilane, 3-methoxyphenyltrimethoxysilane, 3-phenoxyphenyltrimethoxysilane, 3-hydroxyphenyltrimethoxysilane, 3-aminophenyltrimethoxysilane, 3-dimethylaminophenyltrimethoxysilane, 3-acetylaminophenyltrimethoxysilane, 2-methylphenyltrimethoxysilane, 2-ethylphenyltrimethoxysilane, 2-methoxyphenyltrimethoxysilane, 2-phenoxyphenyltrimethoxysilane, 2-hydroxyphenyltrimethoxysilane, 2-aminophenyltrimethoxysilane, 2-dimethylaminophenyltrimethoxysilane, 2-acetylaminophenyltrimethoxysilane, 2,4,6-trimethylphenyltrimethoxysilane, 4-methylbenzyltrimethoxysilane, 4-ethylbenzyltrimethoxysilane, 4-methoxybenzyltrimethoxysilane, 4-phenoxybenzyltrimethoxysilane, 4-hydroxybenzyltrimethoxysilane, 4-aminobenzyltrimethoxysilane, 4-dimethylaminobenzyltrimethoxysilane, and 4-acetylaminobenzyltrimethoxysilane; alkyltrialkoxysilanes such as methyltrimethoxysilane, methyltriethoxysilane, methyltri-n-propoxysilane, methyltriisopropoxysilane, methyltri-n-butoxysilane, methyltri-sec-butoxysilane, methyltri-t-butoxysilane, methyltriphenoxysilane, methyltriacetoxysilane, methyltrichlorosilane, methyltriisopropenoxysilane, methyltris(dimethylsiloxy)silane, methyltris(methoxyethoxy)silane, methyltris(methylethylketoxime)silane, methyltris(trimethylsiloxy)silane, methylsilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-t-butoxysilane, ethyltriphenoxysilane, ethylbistris(trimethylsiloxy)silane, ethyldichlorosilane, ethyltriacetoxysilane, ethyltrichlorosilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-t-butoxysilane, n-propyltriphenoxysilane, n-propyltriacetoxysilane, n-propyltrichlorosilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-t-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-t-butoxysilane, n-butyltriphenoxysilane, n-butyltrichlorosilane, 2-methylpropyltrimethoxysilane, 2-methylpropyltriethoxysilane, 2-methylpropyltri-n-propoxysilane, 2-methylpropyltriisopropoxysilane, 2-methylpropyltri-n-butoxysilane, 2-methylpropyl-tri-sec-butoxysilane, 2-methylpropyltri-t-butoxysilane, 2-methylpropyltriphenoxysilane, 1-methylpropyltrimethoxysilane, 1-methylpropyltriethoxysilane, 1-methylpropyltri-n-propoxysilane, 1-methylpropyltriisopropoxysilane, 1-methylpropyltri-n-butoxysilane, 1-methylpropyltri-sec-butoxysilane, 1-methylpropyltri-t-butoxysilane, 1-methylpropyltriphenoxysilane, t-butyltrimethoxysilane, t-butyltriethoxysilane, t-butyltri-n-propoxysilane, t-butyltriisopropoxysilane, t-butyltri-n-butoxysilane, t-butyltri-sec-butoxysilane, t-butyltri-t-butoxysilane, t-butyltriphenoxysilane, t-butyltrichlorosilane, and t-butyldichlorosilane; alkenyltrialkoxysilanes such as vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-t-butoxysilane, vinyltriphenoxysilane, allyltrimethoxysilane, allyltriethoxysilane, allyltri-n-propoxysilane, allyltriisopropoxysilane, allyltri-n-butoxysilane, allyltri-sec-butoxysilane, allyltri-t-butoxysilane, and allyltriphenoxysilane;

tetraalkoxysilanes such as tetramethoxysilane, tetraethoxysilane, tetra-n-propoxysilane, tetraisopropoxysilane, tetra-n-butoxysilane, tetra-sec-butoxysilane, and tetra-t-butoxysilane;

tetraarylsilanes such as tetraphenoxysilane;

epoxy group-containing silanes such as oxetanyltrimethoxysilane, oxiranyltrimethoxysilane, oxiranylmethyltrimethoxysilane, and 3-glycidyloxypropyltrimethoxysilane;

acid anhydride group-containing silanes such as 3-(trimethoxysilyl)propylsuccinic anhydride, 2-(trimethoxysilyl)ethylsuccinic anhydride, 3-(trimethoxysilyl)propylmaleic anhydride, and 2-(trimethoxysilyl)ethylglutaric anhydride;

tetrahalosilanes such as tetrachlorosilane; and the like.

Among these, tetramethoxysilane and tetraethoxysilane are preferable since the resulting resist underlayer film exhibits excellent dry etching resistance.

It is preferable to use phenyltrimethoxysilane, 4-methylphenyltrimethoxysilane, 4-methoxyphenyltrimethoxysilane, 4-methylbenzyltrimethoxysilane methyltrimethoxysilane, methyltrimethoxysilane, methyltriethoxysilane, methyltri-n-propoxysilane, methyltriisopropoxysilane, methyltri-n-butoxysilane, methyltri-sec-butoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, vinyltrimethoxysilane, vinyltriethoxysilane, allyltrimethoxysilane, or allyltriethoxysilane from the viewpoint of reactivity and ease of handling.

It is preferable to use oxetanyltrimethoxysilane, 3-glycidyloxypropyltrimethoxysilane, 3-(trimethoxysilyl)propylsuccinic anhydride, or 4-hydroxyphenyltrimethoxysilane from the viewpoint of improving the pattern collapse resistance of the resulting resist pattern.

The polysiloxane (A) may be synthesized using an additional silane compound in addition to the silane compound shown by the formula (i). Examples of the additional silane compound include disilanes such as hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(diisopropoxymethylsilyl)-1-(triisopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(diisopropoxymethylsilyl)-2-(triisopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(diisopropoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, bis(dimethylmethoxysilyl)methane, bis(dimethylethoxysilyl)methane, bis(dimethyl-n-propoxysilyl)methane, bis(dimethylisopropoxysilyl)methane, bis(dimethyl-n-butoxysilyl)methane, bis(dimethyl-sec-butoxysilyl)methane, bis(dimethyl-t-butoxysilyl)methane, 1,2-bis(dimethylmethoxysilyl)ethane, 1,2-bis(dimethylethoxysilyl)ethane, 1,2-bis(dimethyl-n-propoxysilyl)ethane, 1,2-bis(dimethylisopropoxysilyl)ethane, 1,2-bis(dimethyl-n-butoxysilyl)ethane, 1,2-bis(dimethyl-sec-butoxysilyl)ethane, 1,2-bis(dimethyl-t-butoxysilyl)ethane, 1-(dimethoxymethylsilyl)-1-(trimethylsilyl)methane, 1-(diethoxymethylsilyl)-1-(trimethylsilyl)methane, 1-(di-n-propoxymethylsilyl)-1-(trimethylsilyl)methane, 1-(diisopropoxymethylsilyl)-1-(trimethylsilyl)methane, 1-(di-n-butoxymethylsilyl)-1-(trimethylsilyl)methane, 1-(di-sec-butoxymethylsilyl)-1-(trimethylsilyl)methane, 1-(di-t-butoxymethylsilyl)-1-(trimethylsilyl)methane, 1-(dimethoxymethylsilyl)-2-(trimethylsilyl)ethane, 1-(diethoxymethylsilyl)-2-(trimethylsilyl)ethane, 1-(di-n-propoxymethylsilyl)-2-(trimethylsilyl)ethane, 1-(diisopropoxymethylsilyl)-2-(trimethylsilyl)ethane, 1-(di-n-butoxymethylsilyl)-2-(trimethylsilyl)ethane, 1-(di-sec-butoxymethylsilyl)-2-(trimethylsilyl)ethane, 1-(di-t-butoxymethylsilyl)-2-(trimethylsilyl)ethane, 1,2-bis(trimethoxysilyl)benzene, 1,2-bis(triethoxysilyl)benzene, 1,2-bis(tri-n-propoxysilyl)benzene, 1,2-bis(triisopropoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(triisopropoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(triisopropoxysilyl)benzene, 1,4-bis(tri-n-butoxysilyl)benzene, 1,4-bis(tri-sec-butoxysilyl)benzene, and 1,4-bis(tri-t-butoxysilyl)benzene; polycarbosilanes such as polydimethoxymethylcarbosilane and polydiethoxymethylcarbosilane; and the like.

The content of the polysiloxane (A) in the resist underlayer film-forming composition is preferably 80 mass % or more, more preferably 90 mass % or more, and still more preferably 95 mass % or more, based on the total solid content of the resist underlayer film-forming composition. The resist underlayer film-forming composition may include only one type of the polysiloxane (A), or may include two or more types of the polysiloxane (A).

The polystyrene-reduced weight average molecular weight (Mw) of the polysiloxane (A) determined by size exclusion chromatography is normally 500 to 50,000, preferably 1000 to 30,000, and more preferably 1000 to 15,000.

The term "polystyrene-reduced weight average molecular weight (Mw)" used herein refers to a value measured by gel permeation chromatography (GPC) using GPC columns manufactured by Tosoh Corporation (G2000HXL×2, G3000HXL×1, G4000HXL×1) (standard: monodisperse polystyrene, flow rate: 1.0 ml/min, eluant: tetrahydrofuran, column temperature: 40° C.).

The silane compound shown by the formula (i) and an optional additional silane compound may be subjected to hydrolysis and condensation by a known method.

Nitrogen-Containing Compound (B)

The nitrogen-containing compound (B) is a compound that includes a basic amino group, or a compound that includes a group that produces a basic amino group due to an acid. The nitrogen-containing compound (B) improves the ashing resistance and the like of the resist underlayer film formed using the resist underlayer film-forming composition. It is conjectured that the nitrogen-containing compound (B) present in the resist underlayer film promotes a crosslinking reaction within the underlayer film, so that the ashing resistance and the like of the resist underlayer film are improved. Examples of the nitrogen-containing compound (B) include compounds used as the acid diffusion controller (C) included in the radiation-sensitive resin composition, and the like. Further examples of the nitrogen-containing compound (B) include a nitrogen-containing compound that includes an ester group and at least one polar group selected from a hydroxyl group and a carboxyl group, a nitrogen-containing compound that includes at least one group selected from a hydroxyl group, a carboxyl group, and an ether group, a nitrogen-containing compound that includes an ester group, and the like.

Examples of the nitrogen-containing compound that includes an ester group and at least one polar group selected from a hydroxyl group and a carboxyl group include the compounds shown by the following formulas (B-1-1) to (B-1-5), and the like.

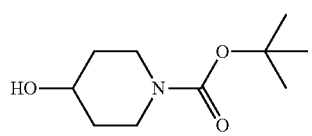
(B-1-1)

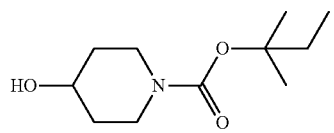
(B-1-2)

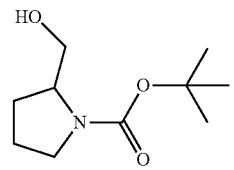
(B-1-3)

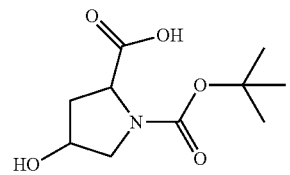
(B-1-4)

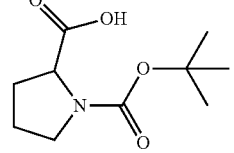
(B-1-5)

Examples of the nitrogen-containing compound that includes at least one group selected from a hydroxyl group, a carboxyl group, and an ether group include the compounds shown by the following formulas (B-2-1) to (B-2-4), and the like. Examples of the nitrogen-containing compound that includes an ester group include the compounds shown by the following formulas (B-3-1) to (B-3-4), and the like.

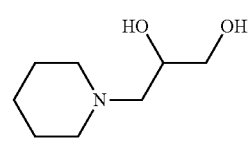
(B-2-1)

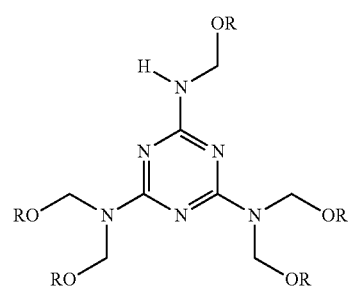
(B-2-2)

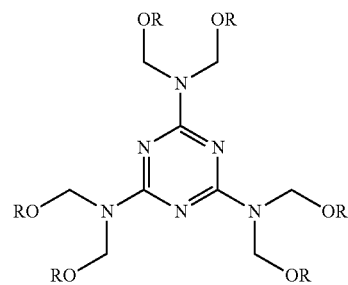
(B-2-3)

(B-2-4)
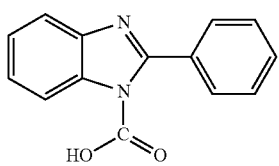

(B-3-1)
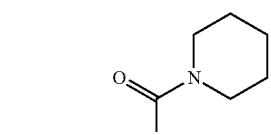

(B-3-2)
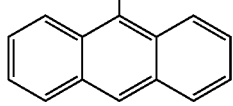

(B-3-3)
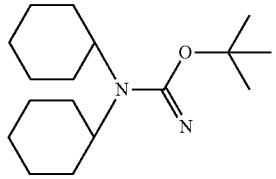

(B-3-4)
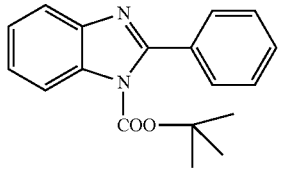

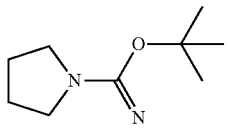

R in the formulas (B-2-2) and (B-2-3) represents an alkyl group having 1 to 10 carbon atoms or a cycloalkyl group having 3 to 10 carbon atoms.

Among these, the nitrogen-containing compound that includes an ester group and at least one polar group selected from a hydroxyl group and a carboxyl group is preferable, and the compound shown by the formula (B-1-1) and the compound shown by the formula (B-1-2) are more preferable. When the nitrogen-containing compound includes an ester group and at least one polar group selected from a hydroxyl group and a carboxyl group, sublimation of the nitrogen-containing compound (B) is suppressed when baking the resist underlayer film, so that the nitrogen-containing compound (B) remains in the resist underlayer film, and sufficiently exhibits the above effect.

These nitrogen-containing compounds (B) may be used either individually or in combination. The nitrogen-containing compound (B) is normally used in an amount of 30 parts by mass or less, preferably 10 parts by mass or less, and more preferably 1 parts by mass or less, based on 100 parts by mass of the polysiloxane (A), from the viewpoint of obtaining an excellent pattern shape.

Acid Generator (C)

The acid generator (C) is a component that generates an acid upon exposure. When the resist underlayer film includes the acid generator (C), dissociation of the acid-labile group included in the polymer within the resist film (pattern) is promoted due to the catalytic effect of an acid generated upon exposure. This improves the resolution and the pattern collapse resistance of the resist pattern. The acid generator (C) may be included in the resist underlayer film-forming composition as a compound (described below), and/or may be included in the polymer.

Examples of the acid generator (C) include onium salts such as sulfonium salts, iodonium salts, and tetrahydrothiophenium salts, N-sulfonyloxyimide compounds, organic halogen compounds, sulfone compounds such as disulfones and diazomethanesulfones, and the like.

Examples of the sulfonium salts include triphenylsulfonium salt compounds such as triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium 2-(3-tetracyclo[4.4.0.1$^{2,5}$.1$^{7,10}$]dodecanyl)-1,1-difluoroethanesulfonate, triphenylsulfonium N,N'-bis(nonafluoro-n-butanesulfonyl)imidate, triphenylsulfonium salicylate, triphenylsulfonium camphorsulfonate, and triphenylsulfonium tricyclo[3.3.1.1$^{3,7}$]decanyldifluoromethanesulfonate; 4-cyclohexylphenyldiphenylsulfonium salt compounds such as 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium 2-(3-tetracyclo[4.4.0.1$^{2,5}$.1$^{7,10}$]dodecanyl)-1,1-difluoroethanesulfonate, 4-cyclohexylphenyldiphenylsulfonium N,N'-bis(nonafluoro-n-butanesulfonyl)imidate, and 4-cyclohexylphenyldiphenylsulfonium camphorsulfonate; 4-t-butylphenyldiphenylsulfonium salt compounds such as 4-t-butylphenyldiphenylsulfonium trifluoromethanesulfonate, 4-t-butylphenyldiphenyl sulfonium nonafluoro-n-butanesulfonate, 4-t-butylphenyldiphenylsulfonium perfluoro-n-octanesulfonate, 4-t-butylphenyldiphenylsulfonium 2-bicyclo[2.2.1]hept-2-yl-1,1,2,2-tetrafluoroethanesulfonate, 4-t-butylphenyldiphenylsulfonium 2-(3-tetracyclo[4.4.0.1$^{2,5}$.1$^{7,10}$]dodecanyl)-1,1-difluoroethanesulfonate, 4-t-butylphenyldiphenylsulfonium N,N'-bis(nonafluoro-n-butanesulfonyl)imidate, and 4-t-butylphenyldiphenylsulfonium camphorsulfonate; tri(4-t-butylphenyl)sulfonium salt compounds such as tri(4-t-butylphenyl)sulfonium trifluoromethanesulfonate, tri(4-t-butylphenyl)sulfonium nonafluoro-n-butanesulfonate, tri(4-t-butylphenyl)sulfonium perfluoro-n-octanesulfonate, tri(4-t-butylphenyl)sulfonium 2-bicyclo[2.2.1]hept-2-yl-1,1,2,2-tetrafluoroethanesulfonate, tri(4-t-butylphenyl)sulfonium 2-(3-tetracyclo[4.4.0.1$^{2,5}$.1$^{7,10}$]dodecanyl)-1,1-difluoroethanesulfonate, tri(4-t-butylphenyl)sulfonium N,N'-bis(nonafluoro-n-butanesulfonyl)imidate, and tri(4-t-butylphenyl)sulfonium camphorsulfonate; and the like.

Examples of the iodonium salts include diphenyliodonium salt compounds such as diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium 2-(3-tetracyclo[4.4.0.1$^{2,5}$.1$^{7,10}$]dodecanyl)-1,1-difluoroethanesulfonate, diphenyliodonium N,N'-bis(nonafluoro-n-butanesulfonyl)imidate, and diphenyliodonium camphorsulfonate; bis(4-t-butylphenyl)iodonium salt compounds such as bis(4-t-butylphenyl)iodonium trifluoromethanesulfonate, bis(4-t- butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium 2-(3-tetracyclo[4.4.0.1$^{2,5}$.1$^{7,10}$]dodecanyl)-1,1-difluoroethanesulfonate, bis(4-t-butylphenyl)iodonium N,N'-bis(nonafluoro-n-butanesulfonyl)imidate, and bis(4-t-butylphenyl)iodonium camphorsulfonate; and the like.

Examples of the tetrahydrothiophenium salts include 1-(4-n-butoxynaphthalen-1-yl)tetrahydrothiophenium salt compounds such as 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium 2-(3-tetracyclo[4.4.0.1$^{2,5}$.1$^{7,10}$]dodecanyl)-1,1-difluoroethanesulfonate, 1-(4-n-butoxynaphthalen-1-yl)tetrahydrothiophenium N,N'-bis(nonafluoro-n-butanesulfonyl)imidate, and 1-(4-n-butoxynaphthalen-1-yl)tetrahydrothiophenium camphorsulfonate; 1-(3,5-dimethyl-4-hydroxyphenyl)tetrahydrothiophenium salt compounds such as 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium 2-(3-tetracyclo[4.4.0.1$^{2,5}$.1$^{7,10}$]dodecanyl)-1,1-difluoroethanesulfonate, 1-(3,5-dimethyl-4-hydroxyphenyl)tetrahydrothiophenium N,N'-bis(nonafluoro-n-butanesulfonyl)imidate, and 1-(3,5-dimethyl-4-hydroxyphenyl)tetrahydrothiophenium camphorsulfonate; and the like.

Examples of the N-sulfonyloxyimide compounds include succinimide compounds such as N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hept-2-yl-1,1,2,2-tetrafluoroethanesulfonyloxy)succinimide, N-(2-(3-tetracyclo[4.4.0.1$^{2,5}$.1$^{7,10}$]dodecanyl)-1,1-difluoroethanesulfonyloxy)succinimide, and N-(camphorsulfonyloxy)succinimide; bicyclo[2.2.1]hept-5-ene-2,3-dicarboxylmide compounds such as N-(trifluoromethanesulfonyloxy)bicyclo[2.2.1]hept-5-ene-2,3-dicarboxylmide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy) bicyclo[2.2.1]hept-5-ene-2,3-dicarboxylmide, N-(2-(3-tetracyclo[4.4.0.1$^{2,5}$.1$^{7,10}$]dodecanyl)-1,1-difluoroethanesulfonyloxy) bicyclo[2.2.1]hept-5-ene-2,3-dicarboxylmide, and N-(camphorsulfonyloxy)bicyclo[2.2.1]hept-5-ene-2,3-dicarboxylmide; and the like. Among these, the sulfonium salts are preferable, the triphenylsulfonium salt compounds are more preferable, and triphenylsulfonium trifluoromethanesulfonate and triphenylsulfonium tricyclo[3.3.1.1$^{3,7}$]decanyldifluoromethanesulfonate are still more preferable. These acid generators (C) may be used either individually or in combination.

The acid generator (C) is normally used in an amount of 30 parts by mass or less, preferably 20 parts by mass or less, more preferably 10 parts by mass or less, and particularly preferably 1 parts by mass or less, based on 100 parts by mass of the polysiloxane (A), from the viewpoint of obtaining an excellent pattern shape.

Solvent (D)

The resist underlayer film-forming composition normally includes the solvent (D). A known organic solvent may be used as the solvent (D), for example. Examples of the solvent (D) include the organic solvents that may be used as the developer in the step (4) of the resist pattern-forming method. The solvent (D) is preferably an alcohol solvent or an ester solvent, more preferably a polyhydric alcohol partial ether solvent or a polyhydric alcohol monoalkyl ether acetate solvent, and still more preferably propylene glycol monoethyl ether, propylene glycol monopropyl ether, or propylene glycol monomethyl ether acetate.

The resist underlayer film-forming composition may include water. The silicon-containing compound is hydrated due to water, so that the storage stability of the resist underlayer film-forming composition is improved. Moreover, a curing reaction is promoted when forming the resist underlayer film, so that a dense film can be obtained. Water is preferably used in an amount of 0 to 30 parts by mass, more preferably 0.1 to 20 parts by mass, and still more preferably 0.2 to 15 parts by mass, based on 100 parts by mass of the solvent (D). If the amount of water is too large, the storage stability and the uniformity of the film may deteriorate.

Additional Optional Component

The resist underlayer film-forming composition may further include a beta-diketone, colloidal silica, colloidal alumina, an organic polymer, a surfactant, a base generator, or the like as an additional optional component.

Preparation of Resist Underlayer Film-Forming Composition

The resist underlayer film-forming composition may be prepared by an arbitrary method. For example, the resist underlayer film-forming composition may be prepared by dissolving or dispersing the polysiloxane (A), the nitrogen-containing compound (B) (optional), the acid generator (C) (optional), and an additional optional component in the solvent (D). The solid content of the resist underlayer film-forming composition is normally 0.5 to 20 mass %, and preferably 1 to 15 mass %.

Radiation-Sensitive Resin Composition

The radiation-sensitive resin composition includes the polymer (a1) that changes in polarity and decreases in solubility in an organic solvent due to an acid. The radiation-sensitive resin composition may preferably include (a2) a polymer and (b) a photoacid generator (hereinafter may be referred to as "acid generator (b)"), and may also include an additional optional component as long as the effects of the invention are not impaired. Each component is described in detail below.

Polymer (a1)

The polymer (a1) changes in polarity and decreases in solubility in an organic solvent due to an acid. The polymer (a1) is preferably a polymer that includes an acid-labile group, and more preferably a polymer that includes the structural unit (I) shown by the formula (1).

Structural Unit (I)

The structural unit (I) is shown by the formula (1).

In the formula (1), R represents a hydrogen atom or a methyl group, and $R^{p1}$, $R^{p2}$, and $R^{p3}$ individually represent a monovalent hydrocarbon group having 1 to 20 carbon atoms, and optionally $R^{p2}$ and $R^{p3}$ may bond to each other to form a divalent alicyclic hydrocarbon group having 4 to 20 carbon atoms together with the carbon atom bonded to $R^{p2}$ and $R^{p3}$.

The monovalent hydrocarbon group having 1 to 20 carbon atoms represented by $R^{p1}$, $R^{p2}$, and $R^{p3}$ is preferably a chain-like hydrocarbon group having 1 to 4 carbon atoms or an alicyclic hydrocarbon group having 4 to 20 carbon atoms. The alicyclic hydrocarbon group may be a monoalicyclic hydrocarbon group, or may be a polyalicyclic hydrocarbon group. The term "monoalicyclic hydrocarbon group" used herein refers to a monocyclic group that does not include an aromatic group, and the term "polyalicyclic hydrocarbon group" used herein refers to a polycyclic group that does not include an aromatic group. Since the polymer (a1) does not include a structural unit that includes an aromatic group having strong absorption at 193 nm, a deterioration in sensitivity and pattern shape can be suppressed.

Examples of the monoalicyclic hydrocarbon group include a group derived from cyclopentane, cyclohexane, or the like. Examples of the polyalicyclic hydrocarbon group include a group derived from adamantane, norbornane, isobornane, tricyclodecane, tetracyclododecane, or the like. When the acid-labile group includes an alicyclic hydrocarbon group, a part or all of the hydrogen atoms of the alicyclic hydrocarbon group may be substituted with an alkyl group having 1 to 8 carbon atoms.

Examples of the structural unit (I) include the structural units shown by the following formulas (1-1) to (1-14), and the like. The structural units shown by the formulas (I-1) to (1-14) are structural units derived from a methacrylate. Note that the structural unit (I) may be a structural unit that is derived from an acrylate and has a structure similar to that of any of the structural units shown by the formulas (1-1) to (1-14).

(1-1)

(1-2)

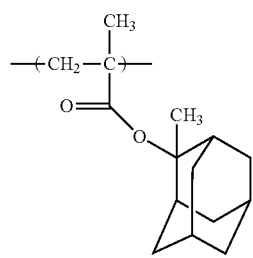

(1-3)

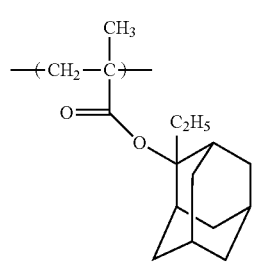

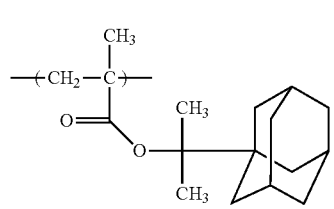

(1-4)

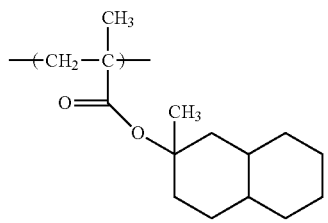

(1-5)

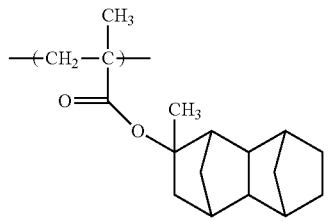

(1-6)

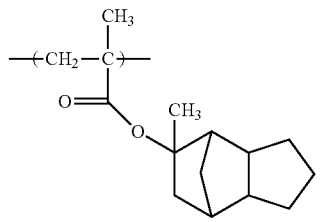

(1-7)

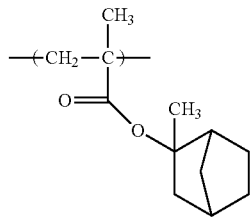

(1-8)

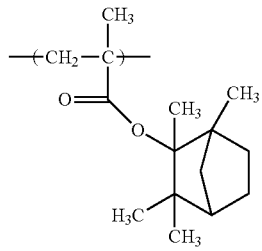

(1-9)

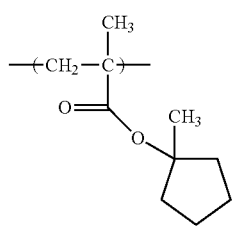

(1-10)

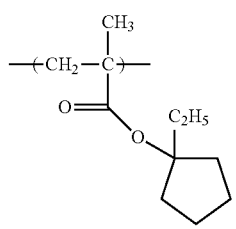

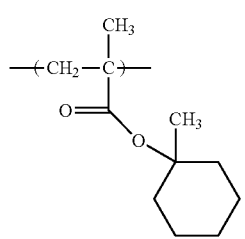 (1-11)

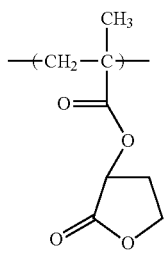 (2-1)

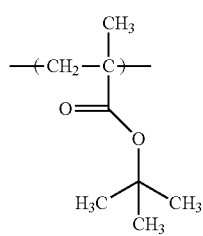 (1-12)

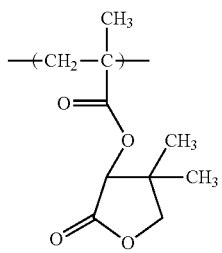 (2-2)

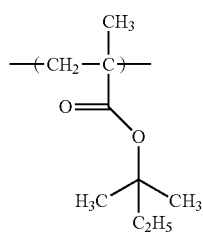 (1-13)

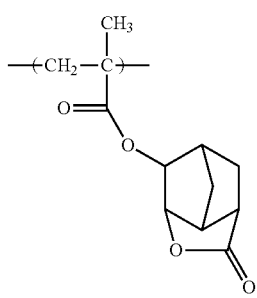 (2-3)

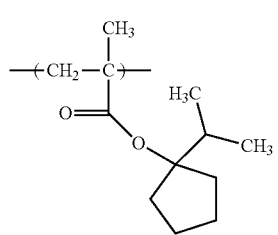 (1-14)

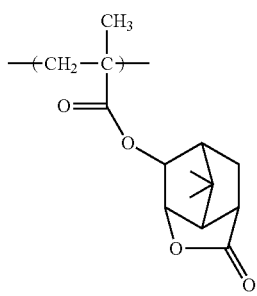 (2-4)

Among these, the structural units shown by the formulas (1-1), (1-3), (1-9), and (1-14) are preferable.

The content of the structural unit (I) in the polymer (a1) is preferably 30 to 70 mol % based on the total structural units included in the polymer (a1). The polymer (a1) may include only one type of the structural unit (I), or may include two or more types of the structural unit (I).

Structural Unit (II)

It is preferable that the polymer (a1) include a structural unit (II) that includes a lactone-containing group or a cyclic carbonate-containing group and is derived from an acrylate. If the polymer (a1) includes the structural unit (II), the resist film formed using the radiation-sensitive resin composition exhibits improved adhesion to the substrate and improved affinity to the developer. The term "lactone-containing group" used herein refers to a group that includes one ring (lactone ring) that includes a structure shown by —O—C(O)—. The term "cyclic carbonate-containing group" used herein refers to a cyclic group that includes one ring (cyclic carbonate ring) that includes a bond shown by —O—C(O)—O—. Examples of the structural unit (II) include the structural units shown by the following formulas (2-1) to (2-19), and the like.

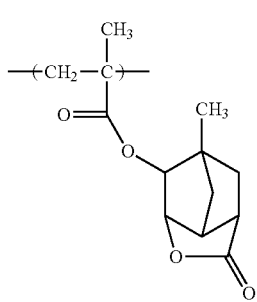 (2-5)

(2-6)
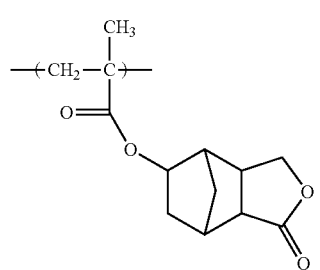
(2-7)
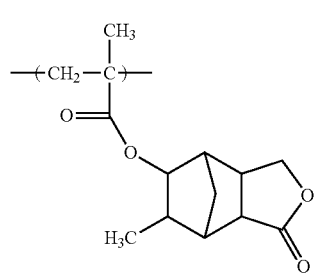
(2-8)
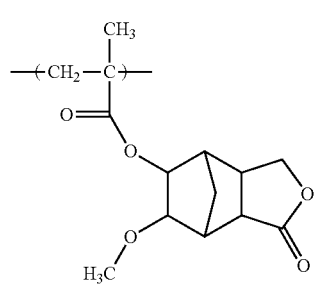
(2-9)
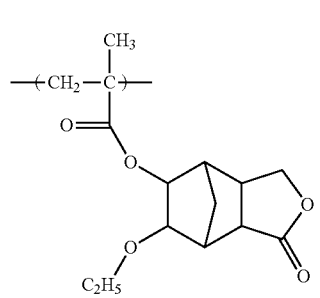
(2-10)
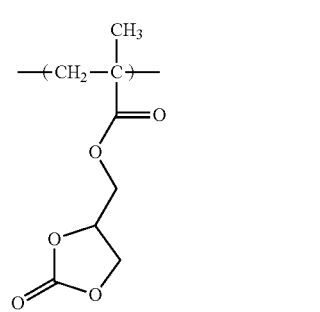
(2-11)
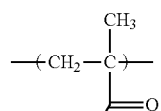
(2-12)
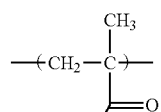
(2-13)
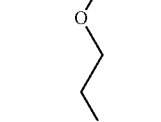
(2-14)

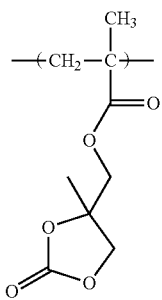

(2-15)

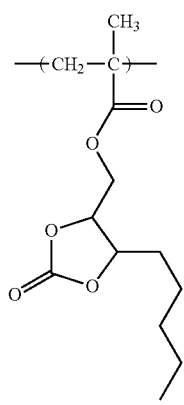

(2-16)

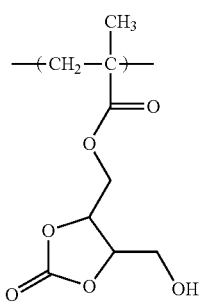

(2-17)

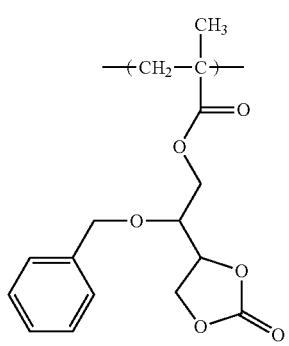

(2-18)

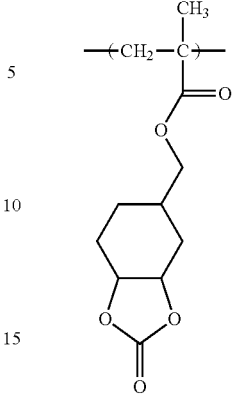

(2-19)

Among these, the structural units that include a lactone-containing group and are derived from an acrylate are preferable, and the structural unit shown by the formula (2-1) and the structural unit shown by the formula (2-3) are more preferable.

The content of the structural unit (II) in the polymer (a1) is preferably 20 to 70 mol %, and more preferably 30 to 60 mol %, based on the total structural units included in the polymer (a1).

Additional Structural Unit

The polymer (a1) may further include an additional structural unit such as a structural unit that is derived from a (meth)acrylate that includes a polar group (e.g., hydroxyl group, carboxyl group, cyano group, and ketonic carbonyl group), or a non-acid-labile structural unit that is derived from a (meth)acrylate and includes an alicyclic structure. Examples of a structural unit derived from a (meth)acrylate that includes a hydroxyl group include a structural unit derived from 3-hydroxy-1-adamantyl(meth)acrylate, a structural unit derived from 2-hydroxyethyl(meth)acrylate, and the like. Examples of a structural unit derived from a (meth)acrylate that includes a cyano group include a structural unit derived from 2-cyanomethyl-2-adamantyl(meth)acrylate, a structural unit derived from 2-cyanoethyl (meth)acrylate, and the like. Examples of a structural unit derived from a (meth)acrylate that includes a ketonic carbonyl group include a structural unit derived from 4-oxo-1-adamantyl(meth)acrylate, a structural unit derived from 5-oxo-[2.2.1]hept-2-yl (meth)acrylate, and the like.

The content of the additional structural unit in the polymer (a1) is normally 30 mol % or less, and preferably 20 mol % or less, based on the total structural units included in the polymer (a1).

Polymer (a2)

The polymer (a2) includes a structural unit (III). When the radiation-sensitive resin composition includes the polymer (a2) that includes the above specific structural unit that includes a fluorine atom, the polymer (a2) is unevenly distributed in the surface layer of the resulting resist film, so that elution of the acid generator (b) and the like from the resist film into the immersion liquid can be suppressed during liquid immersion lithography. Moreover, it is possible to implement a higher speed scan due to an increase in the hydrophobicity of the surface of the resist film.

The structural unit (III) is at least one structural unit selected from the group consisting of a structural unit (III-1) shown by the formula (3-1) and a structural unit (III-2) shown by the formula (3-2).

Structural Unit (III-1)

The structural unit (III-1) is shown by the formula (3-1).

In the formula (3-1), $R^1$ represents a hydrogen atom, a methyl group, or a trifluoromethyl group, and $R^2$ represents a linear or branched alkyl group having 1 to 6 carbon atoms that includes a fluorine atom, or a monovalent alicyclic group having 4 to 20 carbon atoms that includes a fluorine atom, wherein a part or all of the hydrogen atoms of the alkyl group or the alicyclic hydrocarbon group may be substituted with a substituent.

Examples of the linear or branched alkyl group having 1 to 6 carbon atoms include a methyl group, an ethyl group, an n-propyl group, an n-butyl group, and the like.

Examples of the monovalent alicyclic hydrocarbon group having 4 to 20 carbon atoms include a cyclopentyl group, a cyclopentylpropyl group, a cyclohexyl group, a cyclohexylmethyl group, a cycloheptyl group, a cyclooctyl group, a cyclooctylmethyl group, and the like.

Examples of a monomer that produces the structural unit (III-1) include trifluoromethyl(meth)acrylate, 2,2,2-trifluoroethyl(meth)acrylate, perfluoroethyl (meth)acrylate, perfluoro-n-propyl(meth)acrylate, perfluoro-i-propyl(meth)acrylate, perfluoro-n-butyl(meth)acrylate, perfluoro-1-butyl (meth)acrylate, perfluoro-t-butyl (meth)acrylate, perfluorocyclohexyl(meth)acrylate, 2-(1,1,1,3,3,3-hexafluoro)propyl (meth)acrylate, 1-(2,2,3,3,4,4,5,5-octafluoro)pentyl(meth)acrylate, 1-(2,2,3,3,4,4,5,5-octafluoro) hexyl(meth)acrylate, perfluorocyclohexylmethyl(meth) acrylate, 1-(2,2,3,3,3-pentafluoro)propyl(meth)acrylate, 1-(2,2,3,3,4,4,4-heptafluoro)pentyl (meth)acrylate, 1-(3,3,4, 4,5,5,6,6,7,7,8,8,9,9,10,10,10-heptadecafluoro)decyl(meth) acrylate, 1-(5-trifluoromethyl-3,3,4,4,5,6,6,6-octafluoro) hexyl(meth)acrylate, and the like.

Examples of the structural unit (III-1) include structural units shown by the following formulas (3-1-1) and (3-1-2), and the like.

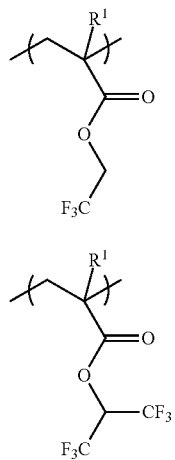

wherein $R^1$ is the same as defined for the formula (3-1).

The content of the structural unit (III-1) in the polymer (a2) is preferably 40 to 100 mol % based on the total structural units included in the polymer (a2). The polymer (a2) may include only one type of the structural unit (III-1), or may include two or more types of the structural unit (III-1).

Structural Unit (III-2)

The structural unit (III-2) is shown by the formula (3-2).

In the formula (3-2), $R^3$ represents a hydrogen atom, a methyl group, or a trifluoromethyl group, $R^4$ represents an (m+1)-valent linking group, m is an integer from 1 to 3, X represents a divalent linking group that includes a fluorine atom, and $R^5$ represents a hydrogen atom or a monovalent organic group, wherein a plurality of X and a plurality of $R^5$ may respectively be either identical or different when m is 2 or 3.

Examples of the (m+1)-valent linking group represented by $R^4$ include those mentioned above in connection with $R^1$ in the formula (3-2). When $R^4$ represents a hydrocarbon group, an oxygen atom, a sulfur atom, —NR'—, a carbonyl group, —COO—, or —CONH— may be bonded to the end of $R^4$ that is bonded to X. Note that R' represents a hydrogen atom or a monovalent organic group.

The divalent linking group represented by X in the formula (3-2) is preferably a chain-like hydrocarbon group having 1 to 20 carbon atoms that includes a fluorine atom. Examples of the divalent linking group represented by X include the groups (structures) shown by the following formulas (X-1) to (X-6).

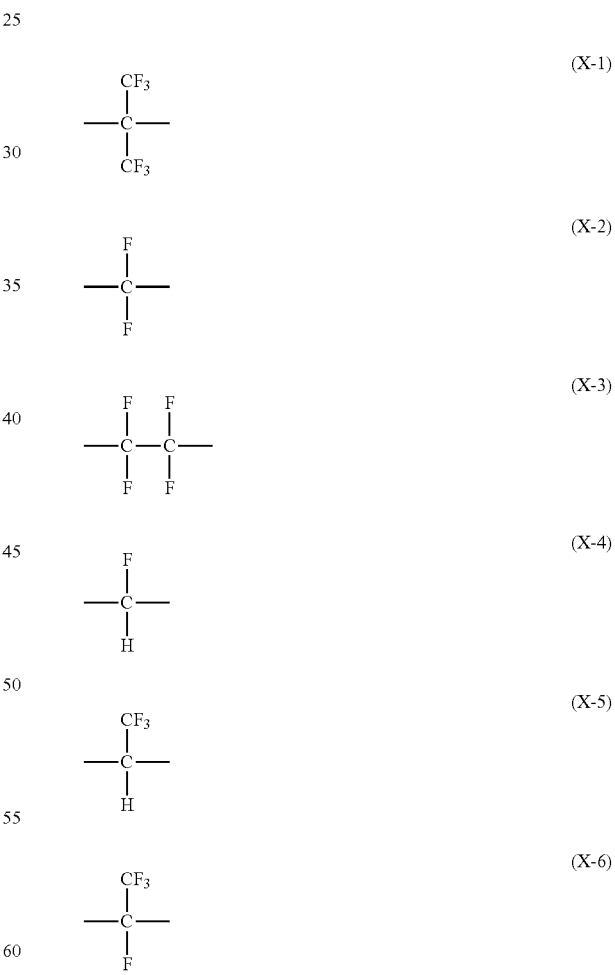

X preferably represents the group shown by the formula (X-1).

Examples of the structural unit (III-2) include structural units shown by the following formulas (3-2-1) and (3-2-2), and the like.

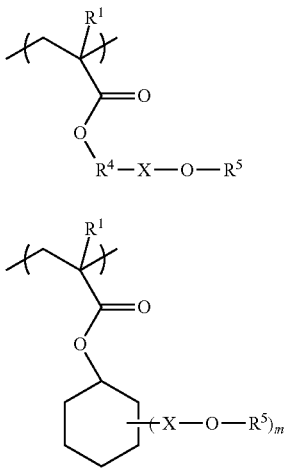

(3-2-1)

(3-2-2)

In the formula (3-2-1), $R^4$ represents a divalent linear, branched, or cyclic saturated or unsaturated hydrocarbon group having 1 to 20 carbon atoms, and $R^3$, X, and $R^5$ are the same as defined for the formula (3-2).

In the formula (3-2-2), $R^3$, X, $R^5$, and m are the same as defined for the formula (3-2), wherein a plurality of X and a plurality of $R^5$ may respectively be either identical or different when m is 2 or 3.

Examples of the structural unit shown by the formula (3-2-1) include structural units shown by the following formulas (3-2-1-1) and (3-2-1-2), and the like. Examples of the structural unit shown by the formula (3-2-2) include a structural unit shown by the following formula (3-2-2-1), and the like.

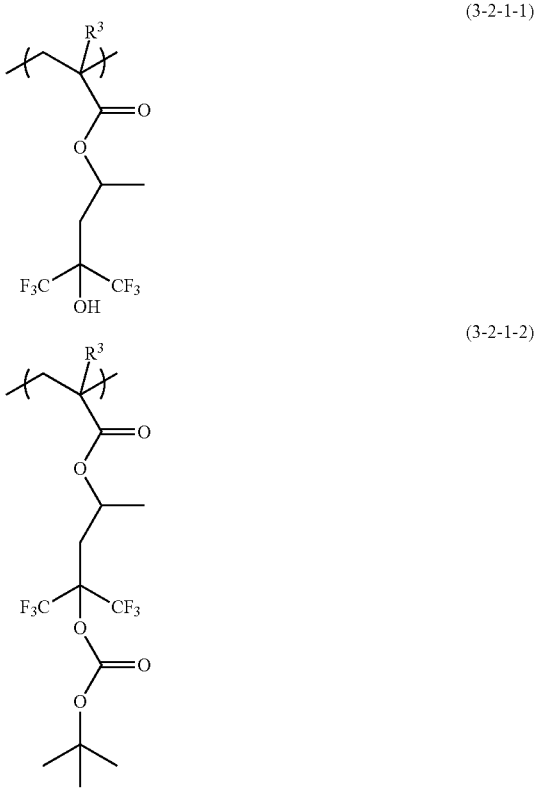

(3-2-1-1)

(3-2-1-2)

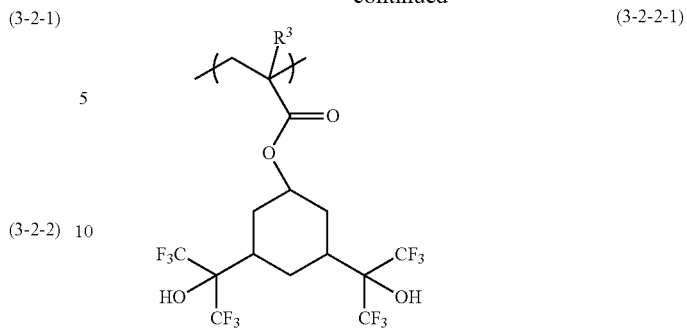

(3-2-2-1)

wherein $R^3$ is the same as defined for the formula (3-2).

Examples of a monomer that produces the repeating unit (III) include (1,1,1-trifluoro-2-trifluoromethyl-2-hydroxy-3-propyl)(meth)acrylate, (1,1,1-trifluoro-2-trifluoromethyl-2-hydroxy-4-butyl)(meth)acrylate, (1,1,1-trifluoro-2-trifluoromethyl-2-hydroxy-5-pentyl)(meth)acrylate, (1,1,1-trifluoro-2-trifluoromethyl-2-hydroxy-4-pentyl)(meth) acrylate, 2-{[5-(1',1',1'-trifluoro-2'-trifluoromethyl-2'-hydroxy)propyl]bicyclo[2.2.1]heptyl}(meth)acrylate, and the like.

The content of the structural unit (III) in the polymer (a2) is preferably 30 to 100 mol % based on the total structural units included in the polymer (a2). The polymer (a2) may include only one type of the structural unit (III), or may include two or more types of the structural unit (III).

The polymer (a2) may further include one or more additional structural units such as a structural unit that includes a lactone structure and improves the solubility in the developer (mentioned above in connection with the polymer (a1)), a structural unit that includes an alicyclic compound and improves the etching resistance, and a structural unit that is derived from an aromatic compound and suppresses reflection from the substrate.

It is preferable that the polymer (a2) does not include an acid-labile group. When the polymer (a2) does not include an acid-labile group, the effect of suppressing elution of the acid generator and the like during liquid immersion lithography can be improved while improving the hydrophobicity of the surface of the resist film. Moreover, occurrence of development defects due to insufficient dissolution can be suppressed eve if the polymer (a2) does not include an acid-labile group when implementing the resist pattern-forming method that utilizes the organic solvent as the developer.

Synthesis of Polymers (a1) and (a2)

The polymers (a1) and (a2) may be synthesized by polymerizing a monomer that produces each structural unit in an appropriate solvent using a radical initiator, for example.

The polymerization temperature is normally 40 to 150° C., and preferably 50 to 120° C. The polymerization time is normally 1 to 48 hours, and preferably 1 to 24 hours.

The Mw of the polymer (a1) is preferably 1000 to 50,000, more preferably 1000 to 30,000, and particularly preferably 1000 to 10,000. If the Mw of the polymer (a1) is within the above range, the polymer (a1) exhibits sufficient solubility in the solvent, and provides the resist pattern with excellent dry etching resistance and an excellent shape.

The ratio (Mw/Mn) of the Mw to the polystyrene-reduced number average molecular weight (Mn) of the polymer (a1) determined by GPC is normally 1 to 3, and preferably 1 to 2.

The Mw of the polymer (a2) determined by GPC is preferably 1000 to 50,000, more preferably 1000 to 30,000, and particularly preferably 1000 to 10,000. If the Mw of the polymer (a2) is less than 1000, a sufficient receding contact angle may not be obtained. If the Mw of the polymer (a2) exceeds 50,000, the resulting resist may exhibit low developability.

The ratio (Mw/Mn) of the Mw to the Mn of the polymer (a2) is normally 1 to 3, and preferably 1 to 2.

Acid Generator (B)

The acid generator (B) included in the radiation-sensitive resin composition generates an acid upon exposure. The acid-labile group or the like included in the polymer (A) dissociates due to the acid generated by the acid generator (B), and produces a polar group (e.g., carboxyl group). As a result, the solubility of the polymer (a1) in the organic solvent decreases. The acid generator (B) may be included in the radiation-sensitive resin composition as a compound (described below) and/or may be included in the polymer.

Examples of the acid generator (B) include onium salt compounds, sulfonimide compounds, halogen-containing compounds, diazoketone compounds, and the like. Among these, it is preferable to use an onium salt compound as the acid generator (B).

Examples of the onium salt compounds include onium salts such as sulfonium salts, tetrahydrothiophenium salts, iodonium salts, and phosphonium salts, N-sulfonyloxyimide compounds, diazonium salts, pyridinium salts, and the like.

Examples of the sulfonium salts include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium camphorsulfonate, triphenylsulfonium 2-(1-adamantyl)-1,1-difluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylphosphonium 1,1,2,2-tetrafluoro-6-(1-adamantanecarbonyloxy)-hexane-1-sulfonate, and the like.

Examples of the tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl) tetrahydrothiophenium 2-bicyclo[2.2.1]hept-2-yl-1,1,2,2-tetrafluoroethanesulfonate, 1-(4-n-butoxynaphthalen-1-yl) tetrahydrothiophenium camphorsulfonate, 1-(6-n-butoxynaphthalen-2-yl)tetrahydrothiophenium trifluoromethanesulfonate, 1-(6-n-butoxynaphthalen-2-yl) tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl) tetrahydrothiophenium 2-bicyclo[2.2.1]hept-2-yl-1,1,2,2-tetrafluoroethanesulfonate, 1-(6-n-butoxynaphthalen-2-yl) tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium2-bicyclo[2.2.1]hept-2-yl-1,1,2,2-tetrafluoroethanesulfonate, 1-(3,5-dimethyl-4-hydroxyphenyl)tetrahydrothiophenium camphorsulfonate, and the like.

Examples of the iodonium salts include diphenyliodonium trifluoromethanesulfonate, diphenyliodonium nona fluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like.

Examples of the N-sulfonyloxyimide compounds include N-(trifluoromethanesulfonyloxy)bicyclo[2.2.1]hept-5-ene-2,3-dicarboxylmide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1]hept-5-ene-2,3-dicarboxylmide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxylmide, N-(camphorsulfonyloxy)bicyclo[2.2.1]hept-5-ene-2,3-dicarboxylmide, and the like.

Among these, onium salts are preferable, and sulfonium salts are more preferable. It is particularly preferable to use triphenylsulfonium 1,1,2,2-tetrafluoro-6-(1-adamantanecarbonyloxy)hexane-1-sulfonate, 4-cyclohexylphenyldiphenylsulfonium nonafluoro-n-butanesulfonate, or triphenylsulfonium 2-(1-adamantyl)-1,1-difluoroethanesulfonate.

These acid generators (b) may be used either individually or in combination. The acid generator (b) is normally used in an amount of 0.1 to 20 parts by mass, and preferably 0.5 to 15 parts by mass, based on 100 parts by mass of the polymer (a1), so that the resulting resist exhibits sufficient sensitivity and developability. If the amount of the acid generator (b) is less than 0.1 parts by mass, the sensitivity and the developability may deteriorate. If the amount of the acid generator (b) exceeds 20 parts by mass, the desired resist pattern may not be obtained due to a decrease in radiation transmittance. The acid generator (b) may be included in the polymer (a1) as a structural unit using a (meth)acrylate that has the above onium salt structure.

Additional Optional Component

The radiation-sensitive resin composition may include (c) an acid diffusion controller, (d) a solvent, an alicyclic skeleton-containing compound, a surfactant, a sensitizer, and the like as additional optional components in addition to the polymer (a1), the polymer (a2), and the acid generator (b), as long as the effects of the invention are not impaired.

Acid Diffusion Controller (c)

The acid diffusion controller (c) controls diffusion of an acid generated by the acid generator (b) upon exposure within the resist film, and suppresses undesired chemical reactions in the unexposed area. This makes it possible to further improve the storage stability of the radiation-sensitive resin composition, further improve the resolution of the resist, and prevent a change in line width of the resist pattern due to a change in post-exposure delay (PED), so that a composition that exhibits excellent process stability can be obtained. The acid diffusion controller (c) may be included in the radiation-sensitive resin composition as a compound (described below) and/or may be included in the polymer.

Examples of the acid diffusion controller (c) include amine compounds, amide group-containing compounds, urea compounds, nitrogen-containing heterocyclic compounds, and the like.

Examples of the amine compounds include mono(cyclo)alkylamines, di(cyclo)alkylamines, tri(cyclo)alkylamines, substituted-alkylanilines or derivatives thereof, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolizinone, 2-quinoxalinol, N,N,N',N'-tetrakis(2-hydroxypropyl)ethylenediamine, N,N,N',N'',N''-pentamethyldiethylenetriamine, and the like.

Examples of the amide group-containing compounds include N-t-butoxycarbonyl group-containing amino compounds, N-t-amyloxycarbonyl group-containing amino compounds, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl)isocyanurate, and the like. Among these, N-t-butoxycarbonyl group-containing amino compounds and N-t-amyloxycarbonyl group-containing amino compounds are preferable, and N-t-butoxycarbonyl-4-hydroxypiperidine, N-t-amyloxycarbonyl-4-hydroxypiperidine, N-t-butoxycarbonylpyrrolidine, N-t-butoxycarbonyl-2-hydroxymethylpyrrolidine, and N-t-butoxycarbonyl-2-phenylbenzimidazole are more preferable.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compounds include imidazoles, pyridines, piperazines, pyrazine, pyrazole, pyridazine, quinoxaline, purine, pyrrolidine, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

A photodegradable base that generates a base upon exposure may be used as the acid diffusion controller (c). Examples of the photodegradable base include onium salt compounds that lose acid-diffusion controllability upon decomposition due to exposure. Examples of the onium salt compounds include sulfonium salt compounds shown by the following formula (c1) and iodonium salt compounds shown by the following formula (c2).

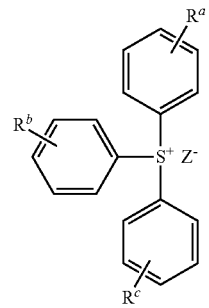

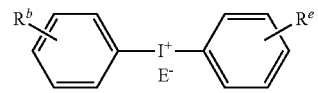

wherein $R^a$ to $R^e$ individually represent a hydrogen atom, an alkyl group, an alkoxy group, a hydroxyl group, or a halogen atom, $Z^-$ and $E^-$ represent $OH^-$, $R^f$—$COO^-$, or $R^f$—$SO_3^-$, and $R^f$ represents an alkyl group, an aryl group, an alkaryl group, or an anion shown by the following formula (d3).

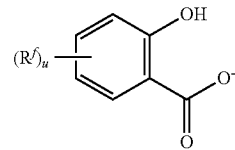

wherein $R^{24}$ represents a linear or branched alkyl group having 1 to 12 carbon atoms in which a part or all of the hydrogen atoms may be substituted with a fluorine atom, or a linear or branched alkoxy group having 1 to 12 carbon atoms, and u is an integer from 0 to 2.

Examples of the photodegradable base include the compounds shown by the following formulas, and the like.

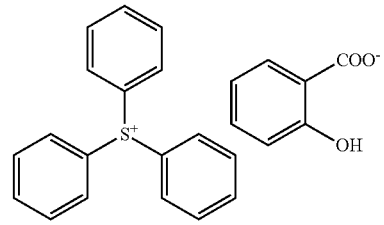

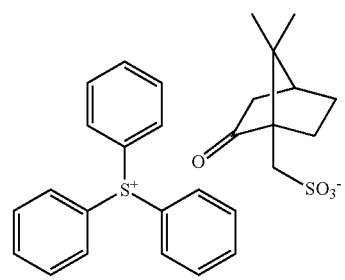

-continued

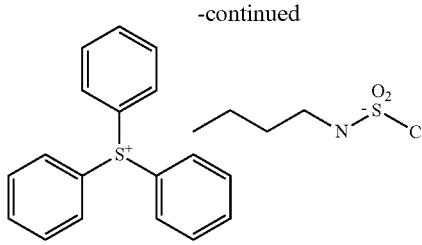

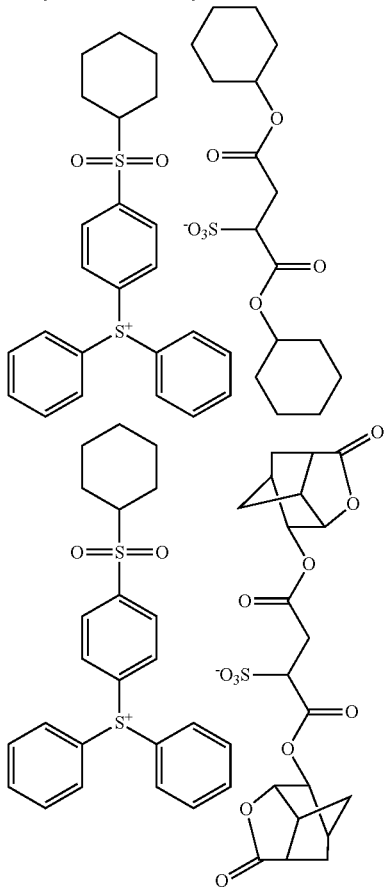

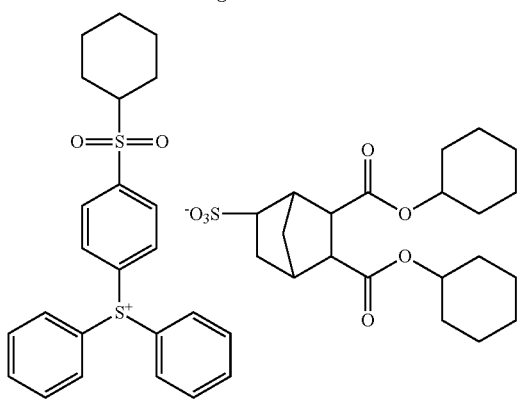

Among these, triphenylsulfonium salicylate, triphenylsulfonium 10-camphorsulfonate, and triphenylsulfonium N-butyltrifluoromethylsulfonamide are preferable.

These acid diffusion controllers (C) may be used either individually or in combination. The acid diffusion controller (D) is preferably used in an amount of less than 5 parts by mass based on 100 parts by mass of the polymer (a1). If the amount of the acid diffusion controller (C) exceeds 5 parts by mass, the sensitivity of the resulting resist may decrease.

Solvent (D)

The radiation-sensitive resin composition normally includes the solvent (D). The solvent is not particularly limited as long as the solvent can dissolve the polymer (a1), the acid generator (B), and additional optional components. Examples of the solvent (D) include alcohol solvents, ether solvents, ketone solvents, amide solvents, ester solvents, a mixture thereof, and the like.

Specific examples of the solvent (D) include the organic solvents mentioned above in connection with the step (4) of the resist pattern-forming method. Among these, propylene glycol monomethyl ether acetate, cyclohexanone, and γ-butyrolactone are preferable. These solvents (D) may be used either individually or in combination.

Alicyclic Skeleton-Containing Compound

The alicyclic skeleton-containing compound improves the dry etching resistance, the pattern shape, adhesion to a substrate, and the like.

Examples of the alicyclic skeleton-containing compound include adamantane derivatives such as 1-adamantanecarboxylic acid, 2-adamantanone, and t-butyl 1-adamantanecarboxylate; deoxycholates such as t-butyl deoxycholate, t-butoxycarbonylmethyl deoxycholate, and 2-ethoxyethyl deoxycholate; lithocholates such as t-butyl lithocholate, t-butoxycarbonylmethyl lithocholate, and 2-ethoxyethyl lithocholate; 3-[2-hydroxy-2,2-bis(trifluoromethyl)ethyl]tetracyclo[4.4.0.1$^{2,5}$.1$^{7,10}$]dodecane, 2-hydroxy-9-methoxycarbonyl-5-oxo-4-oxa-tricyclo[4.2.1.0$^{3,7}$]nonane, and the like. These alicyclic skeleton-containing compounds may be used either individually or in combination.

EXAMPLES

The invention is further described below by way of examples. Note that the invention is not limited to the following examples. The property values were measured by the following methods.

$^{13}$C-NMR Analysis

The polymer was subjected to $^{13}$C-NMR analysis using a nuclear magnetic resonance spectrometer ("JNM-EX270" manufactured by JEOL Ltd.).

Solid Content in Solution Containing Polysiloxane (A)

The solid content (mass %) in a solution containing the polysiloxane (A) was determined by baking 0.5 g of a solution containing the siloxane (A) at 250° C. for 30 minutes, and measuring the mass of the solid contained in the solution.

Synthesis of Polysiloxane (A)

The following silane compounds were used to synthesize the polysiloxane (A).
Silane compound (S-1): tetramethoxysilane
Silane compound (S-2): phenyltrimethoxysilane
Silane compound (S-3): 3-ethyl-3-oxetanylpropyltrimethoxysilane
Silane compound (S-4): methyltrimethoxysilane
Silane compound (S-5): 3-glycidyloxypropyltrimethoxysilane
Silane compound (S-6): 3-(trimethoxysilyl)propylsuccinic anhydride
Silane compound (S-7): 4-hydroxyphenyltrimethoxysilane Synthesis Example 1

Synthesis of Polysiloxane (A-1)

1.28 g of oxalic acid was dissolved in 12.85 g of water with heating to prepare an oxalic acid aqueous solution. A flask charged with 25.05 g of tetramethoxysilane (silane compound (S-1)), 3.63 g of phenyltrimethoxysilane (silane compound (S-2)), and 57.19 g of propylene glycol monoethyl ether was fitted with a cooling tube and a dropping funnel containing the oxalic acid aqueous solution. After heating the mixture to 60° C. using an oil bath, the oxalic acid aqueous solution was slowly added dropwise to the mixture, and the mixture was reacted at 60° C. for 4 hours. After completion of the reaction, the flask containing the reaction solution was allowed to cool, and methanol produced during the reaction was evaporated using an evaporator to obtain 97.3 g of a solution containing a polysiloxane (A-1). The solid content in the solution containing the polysiloxane (A-1) was 18.0 mass %. The Mw of the polysiloxane (A-1) was 2000.

Synthesis Example 2

Synthesis of Polysiloxane (A-2)

2.92 g of tetramethylammonium hydroxide (TMAH) was dissolved in 8.75 g of water with heating to prepare a TMAH aqueous solution. A flask charged with 11.67 g of the TMAH aqueous solution and 4.53 g of water was fitted with a cooling tube and a dropping funnel containing 10.65 g of tetramethoxysilane (silane compound (S-1)), 1.98 g of phenyltrimethoxysilane (silane compound (S-2)), 2.72 g of methyltrimethoxysilane (silane compound (S-4)), and 20 g of methanol. After heating the mixture to 50° C. using an oil bath, the methanol solution of the monomers was slowly added dropwise to the mixture, and the mixture was reacted at 50° C. for 2 hours. After completion of the reaction, the flask containing the reaction solution was allowed to cool.

The reaction solution was added dropwise to 36.67 g of a methanol solution of maleic acid that was prepared by dissolving 4.39 g of maleic anhydride in 16.14 g of water and 16.14 g of methanol, and the mixture was stirred for 30 minutes. After the addition of 50 g of 4-methyl-2-pentenone, the reaction solvent and methanol produced during the reaction were evaporated using an evaporator to obtain a 4-methyl-2-pentenone solution of a polysiloxane. The solution was put in a separating funnel, washed with 80 g of water, and then washed with 40 g of water. After the addition of 50 g of propylene glycol 1-ethyl ether to the 4-methyl-2-pentenone resin solution that had been transferred to a flask from the separating funnel, 4-methyl-2-pentenone was evaporated using an evaporator to obtain 51 g of a solution containing a polysiloxane (A-2). The solid content in the solution containing the polysiloxane (A-2) was 18.0 mass %. The Mw of the polysiloxane (A-2) was 4000.

Synthesis Examples 3 to 10

Synthesis of Polysiloxanes (A-3) to (A-10)

Polysiloxanes (A-3) to (A-10)) were synthesized in the same manner as in Synthesis Example 1, except that the silane compounds and the amounts thereof were changed as shown in Table 1. The solid content in the solution containing the polysiloxane and the Mw of the polysiloxane are shown in Table 1.

TABLE 1

| | | Silane compound | | | |
|---|---|---|---|---|---|
| | Polysiloxane (A) | Type | Amount (mol %) | Mw | Solid content (mass %) |
| Synthesis Example 1 | A-1 | S-1<br>S-2 | 90<br>10 | 2000 | 18 |
| Synthesis Example 2 | A-2 | S-1<br>S-2<br>S-4 | 70<br>10<br>20 | 4000 | 18 |
| Synthesis Example 3 | A-3 | S-1<br>S-3 | 20<br>80 | 1600 | 18 |
| Synthesis Example 4 | A-4 | S-1<br>S-4 | 90<br>10 | 8400 | 18 |
| Synthesis Example 5 | A-5 | S-1<br>S-2<br>S-4 | 70<br>5<br>25 | 1500 | 18 |
| Synthesis Example 6 | A-6 | S-4 | 100 | 1800 | 18 |
| Synthesis Example 7 | A-7 | S-1<br>S-4 | 80<br>20 | 3000 | 18 |
| Synthesis Example 8 | A-8 | S-1<br>S-2<br>S-5 | 80<br>10<br>10 | 3000 | 18 |
| Synthesis Example 9 | A-9 | S-1<br>S-2<br>S-6 | 80<br>10<br>10 | 3000 | 18 |
| Synthesis Example 10 | A-10 | S-1<br>S-4<br>S-7 | 80<br>10<br>10 | 3000 | 18 |

Preparation of Resist Underlayer Film-Forming Composition

The components (nitrogen-containing compound (B), acid generator (C), and solvent (D)) other than the polysiloxane (A) that were used to prepare the resist underlayer film-forming composition are listed below.
Nitrogen-Containing Compound (B)
B-1: N-t-amyloxycarbonyl-4-hydroxypiperidine
B-2: N-t-butoxycarbonyl-4-hydroxypiperidine
Acid Generator (C)
C-1: triphenylsulfonium trifluoromethanesulfonate
C-2: triphenylsulfonium tricyclo[$3.3.1.1^{3,7}$]decanyldifluoromethanesulfonate
Solvent (D)
D-1: propylene glycol monoethyl ether acetate
D-2: propylene glycol monoethyl ether
D-3: propylene glycol monopropyl ether Synthesis Example 11

Preparation of Resist Underlayer Film-Forming Composition (P-1)

9.70 parts by mass of the polysiloxane (A-1) and 0.05 parts by mass of the nitrogen-containing compound (B-1) were dissolved in 68.74 parts by mass of the solvent (D-1) and 21.51 parts by mass of the solvent (D-2). The solution was filtered through a filter having a pore size of 0.2 μm to obtain a resist underlayer film-forming composition (P-1).

Synthesis Examples 12 to 28

Preparation of Resist Underlayer Film-Forming Compositions (P-2) to (P-18)

Resist underlayer film-forming compositions (P-2) to (P-18) were prepared in the same manner as in Synthesis Example 11, except that the components and the amounts thereof were changed as shown in Table 2. Note that the symbol "–" in Table 2 indicates that the component was not used.

TABLE 2

| | Resist underlayer film-forming composition | Solution of polysiloxane (A) Type | Solution of polysiloxane (A) Amount (parts by mass) | Nitrogen-containing compound (B) Type | Nitrogen-containing compound (B) Amount (parts by mass) | Acid generator (C) Type | Acid generator (C) Amount (parts by mass) | Solvent (D) Type | Solvent (D) Amount (parts by mass) | Water Amount (parts by mass) |
|---|---|---|---|---|---|---|---|---|---|---|
| Synthesis Example 11 | P-1 | A-1 | 9.70 | B-1 | 0.05 | — | — | D-1/D-2 | 68.74/21.51 | — |
| Synthesis Example 12 | P-2 | A-1 | 9.70 | B-2 | 0.05 | — | — | D-1/D-2 | 68.74/21.51 | — |
| Synthesis Example 13 | P-3 | A-1 | 9.73 | B-1 | 0.02 | — | — | D-1/D-2 | 68.74/21.51 | — |
| Synthesis Example 14 | P-4 | A-2 | 9.70 | B-1 | 0.05 | — | — | D-1/D-2 | 68.74/21.51 | — |
| Synthesis Example 15 | P-5 | A-1/A-3 | 8.73/0.97 | B-1 | 0.05 | — | — | D-1/D-2 | 68.74/21.51 | — |
| Synthesis Example 16 | P-6 | A-1/A-4 | 9.21/0.49 | B-1 | 0.05 | — | — | D-1/D-2 | 68.74/21.51 | — |
| Synthesis Example 17 | P-7 | A-1/A-6 | 9.21/0.49 | B-1 | 0.05 | — | — | D-1/D-2/D-3 | 68.74/17.92/3.59 | — |
| Synthesis Example 18 | P-8 | A-5/A-6 | 9.21/0.49 | B-1 | 0.05 | — | — | D-2/D-3 | 72.33/17.92 | — |
| Synthesis Example 19 | P-9 | A-6/A-7 | 0.49/9.21 | B-1 | 0.05 | — | — | D-1/D-2/D-3 | 68.74/17.92/3.59 | — |
| Synthesis Example 20 | P-10 | A-1 | 9.75 | — | — | — | — | D-1/D-2 | 68.74/21.51 | — |
| Synthesis Example 21 | P-11 | A-8 | 9.75 | — | — | — | — | D-2 | 90.25 | — |
| Synthesis Example 22 | P-12 | A-9 | 9.75 | — | — | — | — | D-1/D-2 | 36.10/54.15 | — |
| Synthesis Example 23 | P-13 | A-10 | 9.75 | — | — | — | — | D-1/D-2 | 68.74/21.51 | — |
| Synthesis Example 24 | P-14 | A-1 | 9.73 | — | — | C-1 | 0.02 | D-1/D-2 | 36.10/54.15 | — |
| Synthesis Example 25 | P-15 | A-2 | 9.70 | — | — | C-2 | 0.05 | D-1/D-2 | 68.74/21.51 | — |
| Synthesis Example 26 | P-16 | A-1 | 9.68 | B-1 | 0.05 | C-1 | 0.02 | D-1/D-2 | 36.10/54.15 | — |
| Synthesis Example 27 | P-17 | A-2 | 9.65 | B-1 | 0.05 | C-2 | 0.05 | D-1/D-2 | 68.74/21.51 | — |
| Synthesis Example 28 | P-18 | A-1 | 9.75 | — | — | — | — | D-1/D-2 | 36.10/54.15 | 1.76 |

Preparation of Radiation-Sensitive Resin Composition

Synthesis of Polymer (a1)

The following monomer compounds were used to synthesize the polymer (a1).

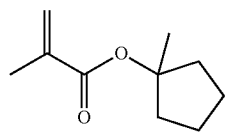
(M-1)

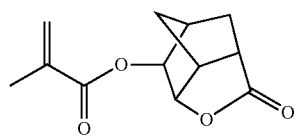
(M-2)

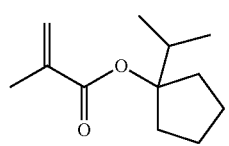
(M-3)

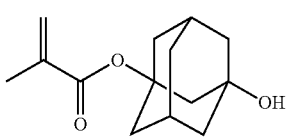
(M-4)

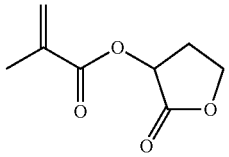
(M-5)

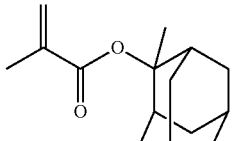
(M-6)

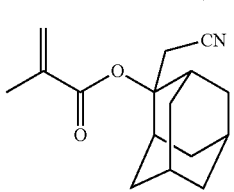
(M-7)

-continued

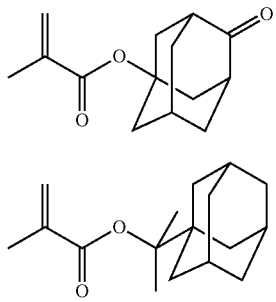

(M-8)

(M-9)

Synthesis Example 29

Synthesis of Polymer (a1-1)

12.9 g (50 mol %) of the compound (M-1) and 17.1 g (50 mol %) of the compound (M-2) were dissolved in 60 g of methyl ethyl ketone, and 1.77 g of 2,2'-azobisisobutyronitrile (AIBN) was added to the solution to prepare a monomer solution. A three-necked flask (200 ml) charged with 30 g of methyl ethyl ketone was purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled with water to 30° C. or less, and poured into 600 g of methanol. A white powder that precipitated by this operation was filtered off. The white powder was washed twice with 150 g of methanol in a slurry state, filtered off again, and dried at 50° C. for 17 hours to obtain a white powdery polymer (a1-1) (yield: 80%). The ratio of the content of structural units derived from the compound (M-1) to the content of structural units derived from the compound (M-2) in the polymer (a1-1) determined by $^{13}$C-NMR analysis was 49/51 (mol %). The polymer (a1-1) had an Mw of 6900 and a dispersity (Mw/Mn) of 1.35.

Synthesis Example 30

Synthesis of Polymer (a1-2)

14.1 g (50 mol %) of the compound (M-3) and 15.9 g (50 mol %) of the compound (M-2) were dissolved in 60 g of methyl ethyl ketone, and 0.5 g of AIBN was added to the solution to prepare a monomer solution. A three-necked flask (200 ml) charged with 30 g of methyl ethyl ketone was purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled with water to 30° C. or less, and poured into 600 g of methanol. A white powder that precipitated by this operation was filtered off. The white powder was washed twice with 150 g of methanol in a slurry state, filtered off again, and dried at 50° C. for 17 hours to obtain a white powdery polymer (a1-2) (yield: 76.5%). The ratio of the content of structural units derived from the compound (M-3) to the content of structural units derived from the compound (M-2) in the polymer (a1-2) determined by $^{13}$C-NMR analysis was 48/52 (mol %). The polymer (a1-2) had an Mw of 13,200 and a dispersity (Mw/Mn) of 1.53.

Synthesis Example 31

Synthesis of Polymer (a1-3)

11.1 g (40 mol %) of the compound (M-1), 3.9 g (10 mol %) of the compound (M-4), 3.9 g (10 mol %) of the compound (M-6), and 11.2 g (40 mol %) of the compound (M-5) were dissolved in 60 g of methyl ethyl ketone, and 1.3 g of AIBN was added to the solution to prepare a monomer solution. A three-necked flask (200 ml) charged with 30 g of methyl ethyl ketone was purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled with water to 30° C. or less, and poured into 600 g of methanol. A white powder that precipitated by this operation was filtered off. The white powder was washed twice with 150 g of methanol in a slurry state, filtered off again, and dried at 50° C. for 17 hours to obtain a white powdery polymer (a1-3) (Mw: 6400, Mw/Mn: 1.43, yield: 72.1%). The ratio of the content of structural units derived from the compound (M-1), the content of structural units derived from the compound (M-4), the content of structural units derived from the compound (M-6), and the content of structural units derived from the compound (M-5) in the polymer (a1-3) was 38/10/11/41 (mol %).

Synthesis Example 32

Synthesis of Polymer (a1-4)

12.7 g (50 mol %) of the compound (M-1), 3.9 g (10 mol %) of the compound (M-7), and 13.4 g (40 mol %) of the compound (M-2) were dissolved in 60 g of methyl ethyl ketone, and 1.2 g of AIBN was added to the solution to prepare a monomer solution. A three-necked flask (200 ml) charged with 30 g of methyl ethyl ketone was purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled with water to 30° C. or less, and poured into 600 g of methanol. A white powder that precipitated by this operation was filtered off. The white powder was washed twice with 150 g of methanol in a slurry state, filtered off again, and dried at 50° C. for 17 hours to obtain a white powdery polymer (a1-4) (Mw: 5900, Mw/Mn: 1.42, yield: 72.3%). The ratio of the content of structural units derived from the compound (M-1), the content of structural units derived from the compound (M-7), and the content of structural units derived from the compound (M-2) in the polymer (a1-4) was 48/11/41 (mol %).

Synthesis Example 33

Synthesis of Polymer (a1-5)

12.9 g (50 mol %) of the compound (M-1), 3.6 g (10 mol %) of the compound (M-8), and 13.6 g (40 mol %) of the compound (M-2) were dissolved in 60 g of methyl ethyl ketone, and 1.3 g of AIBN was added to the solution to prepare a monomer solution. A three-necked flask (200 ml) charged with 30 g of methyl ethyl ketone was purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled with water to 30° C. or less, and poured into 600 g of methanol. A white powder that precipitated by this operation was filtered off. The white powder was washed twice with 150 g of methanol in a slurry state, filtered off again, and dried at 50° C. for 17 hours to obtain a white powdery polymer (a1-5) (Mw: 5700, Mw/Mn: 1.38, yield: 72.5%). The ratio of the content of structural units derived from the compound (M-1), the content of structural units derived from the compound (M-8), and the content of structural units derived from the compound (M-2) in the polymer (a1-5) was 49/11/40 (mol %).

Synthesis Example 340

Synthesis of Polymer (a1-6)

12.2 g (45 mol %) of the compound (M-3), 5.5 g (15 mol %) of the compound (M-9), and 12.3 g (40 mol %) of the compound (M-2) were dissolved in 60 g of methyl ethyl ketone, and 0.5 g of AIBN was added to the solution to prepare a monomer solution. A three-necked flask (200 ml) charged with 30 g of methyl ethyl ketone was purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled with water to 30° C. or less, and poured into 600 g of methanol. A white powder that precipitated by this operation was filtered off. The white powder was washed twice with 150 g of methanol in a slurry state, filtered off again, and dried at 50° C. for 17 hours to obtain a white powdery polymer (a1-6) (Mw: 13,400, Mw/Mn: 1.59, yield: 76.3%). The ratio of the content of structural units derived from the compound (M-13), the content of structural units derived from the compound (M-19), and the content of structural units derived from the compound (M-12) in the polymer (a1-6) was 44/15/41 (mol %).

Synthesis of Polymer (a2)

The following monomer compounds were used to synthesize the polymer (a2).

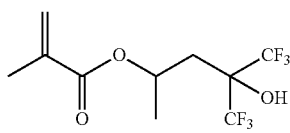
(M-10)

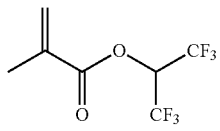
(M-11)

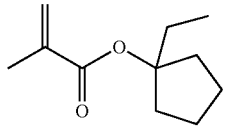
(M-12)

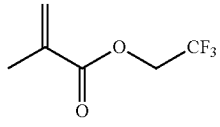
(M-13)

Synthesis Example 35

Synthesis of Polymer (a2-1)

10.4 g (30 mol %) of the compound (M-10) and 19.6 g (70 mol %) of the compound (M-11) were dissolved in 60 g of methyl ethyl ketone, and 0.91 g (5 mol %) of 2,2'-azobis (isobutyronitrile) was added to the solution to prepare a monomer solution. A three-necked flask (200 ml) charged with 30 g of methyl ethyl ketone was purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled with water to 30° C. or less, and poured into 600 g of methanol. A white powder that precipitated by this operation was filtered off. The white powder was washed twice with 150 g of methanol in a slurry state, filtered off again, and dried at 50° C. for 12 hours to obtain a white powdery polymer (a2-1) (Mw: 5900, Mw/Mn: 1.58, yield: 68%). The ratio of the content of structural units derived from the compound (M-10) to the content of structural units derived from the compound (M-11) in the polymer (a2-1) was 31/69 (mol %).

Synthesis Example 36

Synthesis of Polymer (a2-2)

35.8 g (70 mol %) of the compound (M-12) and 14.2 g (30 mol %) of the compound (M-13) were dissolved in 100 g of methyl ethyl ketone, and 3.2 g of dimethyl 2,2'-azobisisobutyrate (initiator) was added to the solution to prepare a monomer solution. A 500 ml three-necked flask was charged with 100 g of methyl ethyl ketone, purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled to 30° C. or less, and washed with 825 g of a methanol/methyl ethyl ketone/hexane mixed solution (2/1/8 (mass ratio)). The solvent was replaced with propylene glycol methyl ether acetate to obtain a solution of a polymer 8 (38.0 g (solid content), yield: 76.0%). The ratio of the content of structural units derived from the compound (M-12) to the content of structural units derived from the compound (M-13) in the polymer (a2-2) determined by $^{13}$C-NMR analysis was 70/30 (mol %). The polymer (a2-2) had an Mw of 7000 and a dispersity (Mw/Mn) of 1.40.

The components (acid generator (b), acid diffusion controller (c), and solvent (d)) other than the polymers (a1) and (a2)) that were used to prepare the radiation-sensitive resin composition are listed below.

Acid Generator (b)

b-1: triphenylsulfonium 1,1,2,2-tetrafluoro-6-(1-adamantanecarbonyloxy)hexane-1-sulfonate (compound shown by the following formula (b-1))

b-2: 4-cyclohexylphenyldiphenylsulfonium nonafluoro-n-butanesulfonate (compound shown by the following formula (b-2))

b-3: triphenylsulfonium 2-(1-adamantyl)-1,1-difluoroethanesulfonate (compound shown by the following formula (b-3))

(b-1)

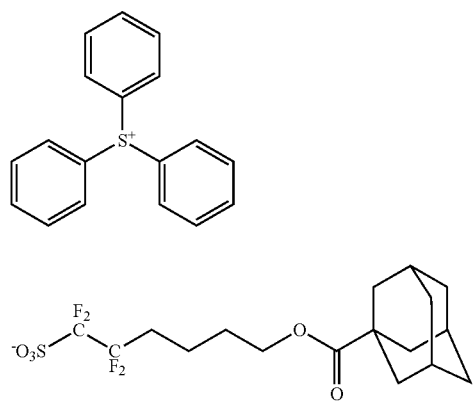

(b-2)

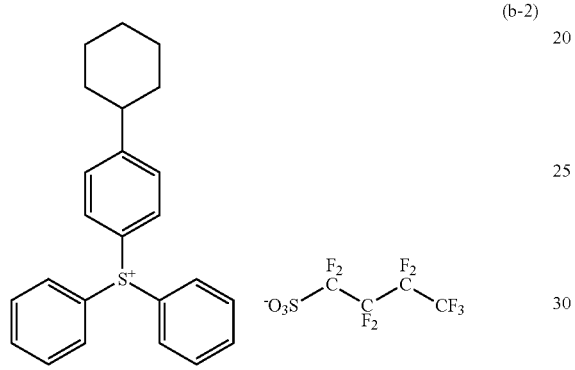

(b-3)

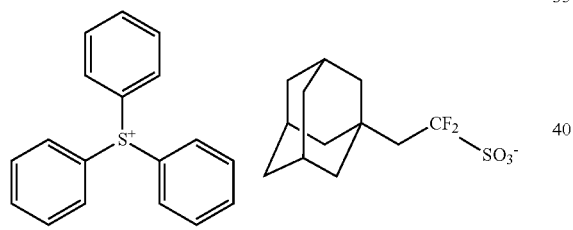

Acid Diffusion Controller (c)

c-1: triphenylsulfonium salicylate (compound shown by the following formula (c-1))

c-2: N-t-amyloxycarbonyl-4-hydroxypiperidine (compound shown by the following formula (c-2))

c-3: N-t-butoxycarbonyl-4-hydroxypiperidine (compound shown by the following formula (c-3))

c-4: triphenylsulfonium 10-camphorsulfonate (compound shown by the following formula (c-4))

c-5: N-t-butoxycarbonylpyrrolidine (compound shown by the following formula (c-5))

c-6: N-t-butoxycarbonyl-2-phenylbenzimidazole (compound shown by the following formula (c-6))

c-7: N-t-butoxycarbonyl-2-hydroxymethylpyrrolidine (compound shown by the following formula (c-7))

c-8: triphenylsulfonium N-butyltrifluoromethylsulfonamide (compound shown by the following formula (c-8))

(c-1)
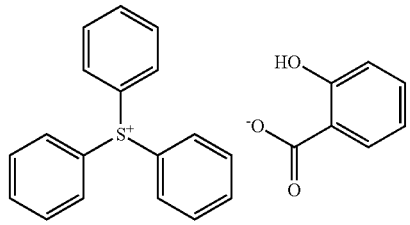

(c-2)
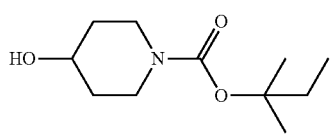

(c-3)
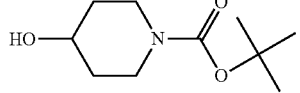

(c-4)
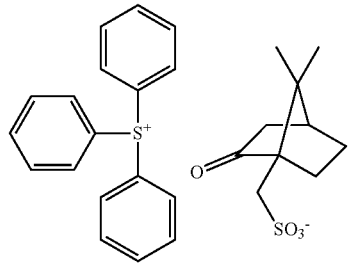

(c-5)
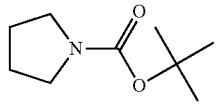

(c-6)
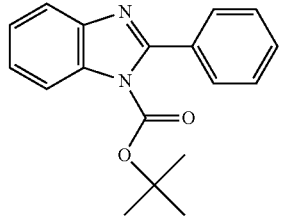

(c-7)
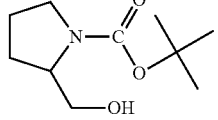

(c-8)
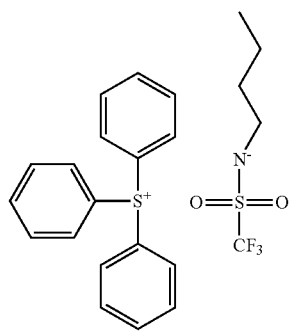

Solvent (d)
d-1: propylene glycol monoethyl ether acetate
d-2: cyclohexanone
d-3: γ-butyrolactone Synthesis Example 37

Preparation of Radiation-Sensitive Resin Composition (J-1)

100 parts of the polymer (a1-1), 3 parts of the polymer (a2-1), 10.8 parts of the acid generator (b-1), 4.3 parts of the acid diffusion controller (c-1), 2185 parts of the solvent (d-1), 935 parts of the solvent (d-2), and 30 parts of the solvent (d-3) were mixed to obtain a radiation-sensitive resin composition (J-1).

Synthesis Examples 38 to 50

Preparation of Radiation-Sensitive Resin Compositions (J-2) to (J-14)

Radiation-sensitive resin compositions (J-2) to (J-14) were prepared in the same manner as in Synthesis Example 37, except that the components and the amounts thereof were changed as shown in Table 3.

silicon wafer using a coater/developer ("CLEAN TRACK ACT 12" manufactured by Tokyo Electron Ltd.) (hereinafter the same unless otherwise specified). The resulting film was prebaked (PB) at 220° C. for 1 minute using a hot plate to form a resist underlayer film. The thickness of the resist underlayer film measured using a film thickness meter ("M-2000D" manufactured by J. A. Woollam) was 30 nm.

Evaluation of Properties

The substrate reflectivity, the residual resist amount, and the oxygen ashing resistance of the resist underlayer film were evaluated by the following methods using the radiation-sensitive resin composition (J-1) obtained in Synthesis Example 37.

Substrate Reflectivity

The refractive index parameter (n) and the extinction coefficient (k) of the resist underlayer film, an antireflective film formed using an antireflective film-forming material ("NFC HM8006" manufactured by JSR Corporation), and a resist film formed using the radiation-sensitive resin composition were measured using a high-speed spectroscopic ellipsometer ("M-2000" manufactured by J. A. Woollam). The substrate reflectivity (NA: 1.3, Dipole) of a stacked film of the resist film, the resist underlayer film, and the antireflective film was calculated from the measured values using simulation software ("Prolith" manufactured by KLA-Tencor). A

TABLE 3

| | | Polymer (a1) | | Polymer (a2) | | Acid generator (B) | | Acid diffusion controller (C) | | Solvent (D) | |
|---|---|---|---|---|---|---|---|---|---|---|---|
| | Radiation-sensitive resin composition | Type | Amount (parts by mass) | Type | Amount (parts by mass) | Type | Amount (parts by mass) | Type | Amount (parts by mass) | Type | Amount (parts by mass) |
| Synthesis Example 37 | J-1 | a1-1 | 100 | a2-1 | 3 | b-1 | 10.8 | c-1 | 4.3 | d-1/d-2/d-3 | 2185/935/30 |
| Synthesis Example 38 | J-2 | a1-1 | 100 | a2-2 | 3 | b-3 | 8.5 | c-2 | 1.7 | d-1/d-2/d-3 | 2200/950/30 |
| Synthesis Example 39 | J-3 | a1-1 | 100 | a2-2 | 3 | b-3 | 8.5 | c-4 | 5.4 | d-1/d-2/d-3 | 2200/950/30 |
| Synthesis Example 40 | J-4 | a1-2 | 100 | a2-2 | 3 | b-3 | 8.0 | c-2 | 0.9 | d-1/d-2/d-3 | 2200/950/30 |
| Synthesis Example 41 | J-5 | a1-2 | 100 | a2-2 | 3 | b-3 | 8.0 | c-4 | 2.1 | d-1/d-2/d-3 | 2200/950/30 |
| Synthesis Example 42 | J-6 | a1-2 | 100 | a2-2 | 3 | b-3 | 8.0 | c-8 | 2.1 | d-1/d-2/d-3 | 2200/950/30 |
| Synthesis Example 43 | J-7 | a1-3 | 100 | a2-1 | 3 | b-2 | 9.6 | c-3 | 1.2 | d-1/d-2/d-3 | 2200/950/30 |
| Synthesis Example 44 | J-8 | a1-3 | 100 | a2-1 | 3 | b-2 | 9.6 | c-6 | 1.7 | d-1/d-2/d-3 | 2200/950/30 |
| Synthesis Example 45 | J-9 | a1-4 | 100 | a2-1 | 3 | b-2 | 9.6 | c-5 | 1.0 | d-1/d-2/d-3 | 2200/950/30 |
| Synthesis Example 46 | J-10 | a1-4 | 100 | a2-1 | 3 | b-2 | 9.6 | c-7 | 1.3 | d-1/d-2/d-3 | 2200/950/30 |
| Synthesis Example 47 | J-11 | a1-4 | 100 | a2-2 | 3 | b-1 | 10.0 | c-5 | 1.0 | d-1/d-2/d-3 | 2200/950/30 |
| Synthesis Example 48 | J-12 | a1-4 | 100 | a2-1 | 3 | b-1 | 10.0 | c-7 | 1.2 | d-1/d-2/d-3 | 2200/950/30 |
| Synthesis Example 49 | J-13 | a1-5 | 100 | a2-2 | 3 | b-3 | 8.0 | c-4 | 2.1 | d-1/d-2/d-3 | 2200/950/30 |
| Synthesis Example 50 | J-14 | a1-6 | 100 | a2-2 | 3 | b-3 | 8.0 | c-4 | 2.1 | d-1/d-2/d-3 | 2200/950/30 |

Evaluation of Properties of Resist Underlayer Film

A resist underlayer film was formed by the following method using the resist underlayer film-forming composition ((P-1) to (P-18)), and the properties of the resist underlayer film were evaluated as described below.

Formation of Resist Underlayer Film

The resist underlayer film-forming composition (P-1) obtained in Synthesis Example 11 was spin-coated onto a case where the substrate reflectivity was 1% or less was evaluated as "A", a case where the substrate reflectivity was more than 1% and 2% or less was evaluated as "B", and a case where the substrate reflectivity was more than 2% was evaluated as "C". The evaluation results are shown in Table 4.

Residual Resist Amount

The radiation-sensitive resin composition was spin-coated onto the resist underlayer film, and prebaked (PB) at 100° C.

for 60 seconds on a hot plate to form a resist film having a thickness of 100 nm. After developing the resist film for 1 minute using butyl acetate, the thickness of the film (resist underlayer film+residual resist film) on the substrate was measured. The thickness of the film was measured using a film thickness meter ("M-2000D" manufactured by J. A. Woollam) (hereinafter the same). The difference between the thickness of the resist underlayer film before development using the organic solvent and the thickness of the film after development was calculated, and taken as the residual resist amount (nm). The results are shown in Table 4. A case where the residual resist amount was less than 5 nm was evaluated as "A", and a case where the residual resist amount was 5 nm or more was evaluated as "B".

Oxygen Ashing Resistance

The resist underlayer film was subjected to an $O_2$ treatment at 100 W for 120 seconds using an ashing system ("NA1300" manufactured by ULVAC). The difference between the thickness of the resist underlayer film before the $O_2$ treatment and the thickness of the resist underlayer film after the $O_2$ treatment was calculated to evaluate the oxygen ashing resistance. The results are shown in Table 4. A case where the difference was less than 5 nm was evaluated as "A", a case where the difference was 5 nm or more and 8 nm or less was evaluated as "B", and a case where the difference was more than 8 nm was evaluated as "C".

Formation of Resist Pattern

Examples 1 to 18

A contact hole pattern (i.e., hole pattern) and a line-and-space pattern (i.e., trench pattern) were formed by the following method using the resist underlayer film-forming composition ((P-1) to (P-18)) and the radiation-sensitive resin composition (J-1) shown in Table 4, and evaluated as described below. The evaluation results are shown in Table 4.

Formation of Contact Hole Pattern

An antireflective film-forming material ("HM8006" manufactured by JSR Corporation) was spin-coated onto a 12-inch silicon wafer, and prebaked (PB) (250° C., 60 seconds) to obtain an antireflective film having a thickness of 100 nm. The resist underlayer film-forming composition (P-1) was spin-coated onto the antireflective film, prebaked (PB) (220° C., 60 seconds), and cooled (23° C., 60 seconds) to form a resist underlayer film having a thickness of 30 nm. The radiation-sensitive resin composition (J-1) was spin-coated onto the resist underlayer film, prebaked (PB) (90° C., 60 seconds), and cooled (23° C., 30 seconds) to form a resist film having a thickness of 100 nm.

The resist film was subjected to reduced projection exposure through a mask (220 nm dot/440 nm pitch) using an ArF immersion scanner ("S610C" manufactured by Nikon Corporation) (NA: 1.30, Quadrupole). The resist film was subjected to PEB (105° C., 60 seconds) on the hot plate of a coater/developer ("CLEAN TRACK Lithius Pro-i" manufactured by Tokyo Electron Ltd.), cooled (23° C., 30 seconds), subjected to puddle development (30 seconds) using butyl acetate as the developer utilizing the development cup of a coater/developer ("CLEAN TRACK ACT 12" manufactured by Tokyo Electron Ltd.), and rinsed with methylisobutyl-carbinol (MIBC). The wafer was spin-dried at 2000 rpm for 15 seconds to obtain a test substrate on which a 55 nm hole/110 nm pitch resist pattern was formed.

Evaluation

The minimum hole dimension, the CDU, and the pattern shape were evaluated by the following methods using the test substrate on which the contact hole pattern was formed. The resist pattern on the test substrate was measured and observed using a scanning electron microscope ("CG-4000" manufactured by Hitachi High-Technologies Corporation).

Minimum Hole Dimension

A dose (mJ/cm$^2$) at which a resist pattern having a hole diameter of 55 nm and a hole-to-hole distance (space) of 55 nm was formed was determined to be an optimum dose. The exposure step was performed while increasing the dose stepwise at a value higher than the optimum dose. In this case, since the diameter of the hole gradually decreases, a hole is not formed at a given dose. A hole size corresponding to the maximum dose at which a hole pattern was formed was defined as the minimum hole dimension (nm), and used as an index of the resolution.

CDU

The diameter of the hole (diameter: 55 nm) formed at the optimum dose was measured at an arbitrary 24 points. The 3σ value that indicates the distribution of the measured values was calculated, and taken as the CDU. A case where the 3σ value was less than 2 nm was evaluated as "A", a case where the 3σ value was 2 nm or more and 3.5 nm or less was evaluated as "B", and a case where the 3σ value was more than 3.5 nm was evaluated as "C".

Pattern Shape

The cross-sectional shape of a 55 nm hole/110 nm pitch hole pattern formed using the resist film formed on the substrate was observed (measured) using a scanning electron microscope ("S-4800" manufactured by Hitachi High-Technologies Corporation). The hole diameter Lb at the bottom of the resist pattern and the hole width La at the top of the resist pattern were measured. A case where "0.9≤(La/Lb)≤1.1" was satisfied was evaluated as "A", and a case where "0.9≤(La/Lb)≤1.1" was not satisfied was evaluated as "B".

Formation of Line-and-Space Pattern

An antireflective film-forming material ("HM8006" manufactured by JSR Corporation) was spin-coated onto a 12-inch silicon wafer, and prebaked (PB) (250° C., 60 seconds) to obtain an antireflective film having a thickness of 100 nm. The resist underlayer film-forming composition (P-1) was spin-coated onto the antireflective film, prebaked (PB) (220° C., 60 seconds), and cooled (23° C., 60 seconds) to form a resist underlayer film having a thickness of 30 nm. The radiation-sensitive resin composition (J-1) was spin-coated onto the resist underlayer film, prebaked (PB) (90° C., 60 seconds), and cooled (23° C., 30 seconds) to form a resist film having a thickness of 100 nm.

The resist layer was subjected to reduced projection exposure through a mask (40 nm line/80 nm pitch) using an ArF immersion scanner ("S610C" manufactured by Nikon Corporation) (NA: 1.30, Dipole). The resist film was subjected to PEB (100° C., 60 seconds) on the hot plate of the coater/developer ("CLEAN TRACK Lithius Pro-i"), cooled (23° C., 30 seconds), subjected to puddle development (30 seconds) using butyl acetate as the developer, and rinsed with MIBC. The wafer was spin-dried at 2000 rpm for 15 seconds to obtain a test substrate on which a 40 nm line/80 nm pitch resist pattern was formed.

Evaluation

The minimum pre-collapse dimension and the pattern shape were evaluated by the following methods using the test substrate. The resist pattern on the test substrate was measured and observed using a scanning electron microscope ("CG-4000" manufactured by Hitachi High-Technologies Corporation).

Minimum Pre-Collapse Dimension

A dose (mJ/cm$^2$) at which a resist pattern having a line width of 40 nm and a line-to-line distance (space) of 40 nm was formed was determined to be an optimum dose. The exposure step was performed while increasing the dose stepwise at a value lower than the optimum dose. In this case, since the line width of the pattern gradually decreases, the resist pattern collapses when the resist pattern has a line width corresponding to a given dose. A line width corresponding to the maximum dose at which the resist pattern did not collapse was defined as the minimum pre-collapse dimension (nm), and used as an index of the pattern collapse resistance.

Pattern Shape

A case where the bottom of the resist pattern was not footed was evaluated as "A", and a case where pattern collapse or footing occurred was evaluated as "B".

Examples 19 to 38

Formation of Resist Underlayer Film and Resist Film

An antireflective film and a resist underlayer film were formed on a 12-inch silicon wafer in the same manner as in Examples 1 to 18. The radiation-sensitive resin composition (see Table 5) was spin-coated onto the resist underlayer film using the coater/developer "CLEAN TRACK ACT 12", and prebaked (PB) at 80° C. for 60 seconds on a hot plate to form a resist film having a thickness of 0.10 μm.

Formation of Contact Hole Pattern

The resist layer was subjected to reduced projection exposure through a mask (216 nm dot/416 nm pitch) and water using an ArF immersion scanner ("S610C" manufactured by Nikon Corporation) (NA: 1.30, Quadrupole). The resist film

TABLE 4

| | | Property evaluation | | | Lithographic evaluation | | | | |
|---|---|---|---|---|---|---|---|---|---|
| | | | | | Contact hole evaluation | | | Line-and-space evaluation | |
| | | | | | | | | Minimum | |
| | Resist underlayer film-forming composition | Radiation-sensitive resin composition | Substrate reflectivity | Residual resist amount (nm) | Oxygen ashing resistance (nm) | Minimum hole dimension (nm) | CDU (nm) | Pattern shape | pre-collapse dimension (nm) | Pattern shape |
| Example 1 | P-1 | J-1 | A | <1 | 3 | 45 | 1.9 | A | 42 | A |
| Example 2 | P-2 | J-1 | A | <1 | 3 | 45 | 1.9 | A | 42 | A |
| Example 3 | P-3 | J-1 | A | <1 | 3 | 45 | 1.9 | A | 36 | A |
| Example 4 | P-4 | J-1 | A | <1 | 3 | 45 | 1.9 | A | 38 | A |
| Example 5 | P-5 | J-1 | A | <1 | 5 | 48 | 2.8 | A | 40 | A |
| Example 6 | P-6 | J-1 | A | <1 | 3 | 45 | 2.5 | A | 36 | A |
| Example 7 | P-7 | J-1 | A | <1 | 5 | 48 | 3.0 | A | 40 | A |
| Example 8 | P-8 | J-1 | A | <1 | 5 | 48 | 3.5 | A | 40 | A |
| Example 9 | P-9 | J-1 | A | <1 | 5 | 48 | 3.5 | A | 42 | A |
| Example 10 | P-10 | J-1 | A | <1 | 7 | 45 | 1.8 | A | 34 | A |
| Example 11 | P-11 | J-1 | A | <1 | 7 | 45 | 1.8 | A | 32 | A |
| Example 12 | P-12 | J-1 | A | <1 | 7 | 45 | 1.8 | A | 32 | A |
| Example 13 | P-13 | J-1 | B | <1 | 7 | 45 | 1.9 | A | 34 | A |
| Example 14 | P-14 | J-1 | A | <1 | 8 | 45 | 1.9 | A | 32 | A |
| Example 15 | P-15 | J-1 | A | <1 | 8 | 45 | 2.0 | A | 32 | A |
| Example 16 | P-16 | J-1 | A | <1 | 5 | 45 | 2.0 | A | 34 | A |
| Example 17 | P-17 | J-1 | A | <1 | 5 | 45 | 2.0 | A | 34 | A |
| Example 18 | P-18 | J-1 | A | <1 | 5 | 45 | 2.0 | A | 34 | A |

As is clear from the results shown in Table 4, a contact hole pattern that exhibited excellent resolution, CDU, and pattern shape, and a line-and-space pattern that exhibited excellent pattern collapse resistance and pattern shape could be formed using the resist pattern-forming method according to one embodiment of the invention. Moreover, the substrate reflectivity, the residual resist amount, and the oxygen ashing resistance were good when using the resist pattern-forming method.

Matching Between Resist Underlayer Film-Forming Composition and Radiation-Sensitive Resin Composition A lithographic performance matching test was performed using each combination of the resist underlayer film-forming composition and the radiation-sensitive resin composition shown in Table 5. A resist underlayer film and a resist film were formed, and a contact hole pattern or a line-and-space pattern was formed as described below. Each pattern was evaluated as described below. The results are shown in Table 5.

was subjected to PEB at the temperature shown in Table 5 for 60 seconds, developed at 23° C. for 30 seconds using n-butyl acetate as the developer, rinsed with MIBC for 10 seconds, and dried to form a contact hole pattern. An optimum dose at which a 60 nm hole/104 nm pitch hole pattern was formed on the wafer was determined to be an optimum dose, and taken as the sensitivity (mJ/cm$^2$).

Evaluation

The depth of focus, the CDU, the minimum hole dimension, and the pattern shape were evaluated by the following methods using the contact hole pattern.

Depth of Focus (DOF)

A DOF at which the size of the contact hole pattern formed using the resist film formed on the substrate at the optimum dose was within ±10% with respect to a 60 nm hole/104 nm pitch pattern and a 60 nm hole/800 nm pitch pattern was determined, and a common DOF region was determined to be the DOF (μm). The dimensions of the hole pattern were measured from above using a scanning electron microscope ("CG4000" manufactured by Hitachi High-Technologies Corporation). The DOF measurement results are shown in Table 5.

CDU

The diameter of the hole of the 60 nm hole pattern formed using the resist film formed on the substrate was measured at an arbitrary 24 points, and the 3σ value that indicates the distribution was taken as the CDU. The results are shown in Table 5.

Minimum Hole Dimension

The resist film was subjected to reduced projection exposure through water using a dot pattern that was designed so that the pattern pitch after reduced projection exposure became 104 nm (diameter), and the minimum hole dimension was measured while increasing the dose. The results are shown in Table 5.

Pattern Shape

The cross-sectional shape of a 60 nm hole/104 nm pitch hole pattern formed using the resist film formed on the substrate was observed (measured) using a scanning electron microscope ("S-4800" manufactured by Hitachi High-Technologies Corporation). The hole diameter Lb at the bottom of the resist pattern and the hole width La at the top of the resist pattern were measured. A case where "0.9≤(La/Lb)≤1.1" was satisfied was evaluated as "A", and a case where "0.9≤(La/Lb)≤1.1" was not satisfied was evaluated as "B".

Formation of Line-and-Space Pattern

The resist layer was subjected to reduced projection exposure through a mask (40 nm line/80 nm pitch) using an ArF immersion scanner ("S610C" manufactured by Nikon Corporation) (NA: 1.30, Dipole). The resist film was subjected to PEB at the temperature shown in Tables 5 to 7 for 60 seconds on the hot plate of the coater/developer ("CLEAN TRACK Lithius Pro-i"), cooled (23° C., 30 seconds), subjected to puddle development (30 seconds) using butyl acetate as the developer, and rinsed with MIBC. The wafer was spin-dried at 2000 rpm for 15 seconds to obtain a test substrate on which a 40 nm line/80 nm pitch resist pattern was formed.

The minimum pre-collapse dimension and the pattern shape were evaluated using the test substrate. The resist pattern on the test substrate was measured and observed using a scanning electron microscope ("CG-4000" manufactured by Hitachi High-Technologies Corporation).

Minimum Pre-Collapse Dimension

The minimum pre-collapse dimension (nm) was measured in the same manner as in Examples 1 to 18, and used as an index of the pattern collapse resistance. The minimum pre-collapse dimension measurement results are shown in Table 5.

Pattern Shape

A case where the bottom of the resist pattern was not footed was evaluated as "A", and a case where pattern collapse or footing occurred was evaluated as "B".

When Using Another Developer

Each item was evaluated in the same manner as described above, except that methyl n-pentyl ketone or anisole was used as the developer instead of n-butyl acetate. The evaluation results obtained when using methyl n-pentyl ketone as the developer are shown in Table 6, and the evaluation results obtained when using anisole as the developer are shown in Table 7.

Comparative Examples 1 to 4

Formation of Resist Underlayer Film and Resist Film

A resist film was formed on a resist underlayer film in the same manner as in Examples 19 to 39, except that the radiation-sensitive resin composition shown in Table 5 was used.

Formation and Evaluation of Contact Hole Pattern and Line-and-Space Pattern

A contact hole pattern and a line-and-space pattern were formed in the same manner as in Examples 19 to 39, except that the PEB temperature shown in Table 5 was employed, and a 2.38 mass % tetramethylammonium hydroxide aqueous solution was used as the developer. The resulting pattern was evaluated in the same manner as in Examples 19 to 39. The evaluation results are shown in Table 5. Note that the contact hole pattern could not be resolved in Comparative Examples 1 to 4. The symbol "–" in Table 5 indicates that the corresponding evaluation was not performed.

TABLE 5

| | Resist underlayer film-forming composition | Radiation-sensitive resin composition | PEB temperature (° C.) | Lithographic evaluation (developer: butyl acetate) | | | | | Line-and-space evaluation | | |
|---|---|---|---|---|---|---|---|---|---|---|---|
| | | | | Contact hole evaluation | | | | | | Minimum | |
| | | | | Sensitivity (mJ/cm$^2$) | DOF (μm) | CDU (nm) | Minimum hole dimension (nm) | Pattern shape | Sensitivity (mJ/cm$^2$) | pre-collapse dimension (nm) | Pattern shape |
| Example 19 | P-10 | J-2 | 105 | 13.5 | 0.10 | 1.7 | 44 | A | 46.0 | 36 | A |
| Example 20 | P-10 | J-3 | 105 | 14.0 | 0.10 | 1.6 | 44 | A | 47.5 | 37 | A |
| Example 21 | P-10 | J-4 | 85 | 12.5 | 0.12 | 1.7 | 43 | A | 42.5 | 34 | A |
| Example 22 | P-10 | J-5 | 85 | 10.5 | 0.12 | 1.6 | 42 | A | 35.5 | 35 | A |
| Example 23 | P-10 | J-6 | 85 | 10.5 | 0.12 | 1.6 | 42 | A | 36.0 | 35 | A |
| Example 24 | P-10 | J-7 | 100 | 10.0 | 0.08 | 2.1 | 47 | A | 34.0 | 38 | A |
| Example 25 | P-10 | J-8 | 105 | 10.5 | 0.08 | 2.2 | 46 | A | 35.0 | 38 | A |
| Example 26 | P-10 | J-9 | 105 | 10.5 | 0.08 | 2.1 | 47 | A | 36.0 | 39 | A |
| Example 27 | P-10 | J-10 | 105 | 10.5 | 0.08 | 2.2 | 46 | A | 36.0 | 39 | A |
| Example 28 | P-10 | J-11 | 105 | 11.5 | 0.08 | 2.0 | 46 | A | 39.0 | 38 | A |
| Example 29 | P-10 | J-12 | 105 | 11.5 | 0.10 | 1.9 | 46 | A | 39.0 | 38 | A |
| Example 30 | P-10 | J-13 | 85 | 11.0 | 0.10 | 1.7 | 43 | A | 37.5 | 37 | A |
| Example 31 | P-10 | J-14 | 105 | 11.5 | 0.08 | 1.6 | 42 | A | 39.0 | 35 | A |
| Example 32 | P-1 | J-2 | 105 | 12.5 | 0.10 | 1.8 | 44 | A | 42.5 | 40 | A |
| Example 33 | P-1 | J-4 | 85 | 12.5 | 0.12 | 1.8 | 43 | A | 42.5 | 37 | A |
| Example 34 | P-1 | J-7 | 100 | 10.0 | 0.08 | 2.2 | 47 | A | 34.0 | 42 | A |
| Example 35 | P-1 | J-14 | 105 | 11.5 | 0.08 | 1.7 | 42 | A | 39.0 | 39 | A |
| Example 36 | P-16 | J-2 | 105 | 12.5 | 0.10 | 1.9 | 44 | A | 42.5 | 36 | A |
| Example 37 | P-16 | J-4 | 85 | 12.5 | 0.12 | 1.9 | 43 | A | 42.5 | 34 | A |
| Example 38 | P-16 | J-7 | 100 | 10.0 | 0.08 | 2.3 | 47 | A | 34.0 | 38 | A |

TABLE 5-continued

Lithographic evaluation (developer: butyl acetate)

| | Resist underlayer film-forming composition | Radiation-sensitive resin composition | PEB temperature (° C.) | Contact hole evaluation | | | | | Line-and-space evaluation | | |
|---|---|---|---|---|---|---|---|---|---|---|---|
| | | | | Sensitivity (mJ/cm$^2$) | DOF (μm) | CDU (nm) | Minimum hole dimension (nm) | Pattern shape | Sensitivity (mJ/cm$^2$) | Minimum pre-collapse dimension (nm) | Pattern shape |
| Example 39 | P-16 | J-14 | 105 | 11.5 | 0.08 | 1.8 | 42 | A | 39.0 | 35 | A |
| Comparative Example 1 | P-10 | J-2 | 105 | Could not be resolved | — | — | — | — | 38.5 | 39 | B |
| Comparative Example 2 | P-10 | J-4 | 85 | Could not be resolved | — | — | — | — | 38.5 | 39 | B |
| Comparative Example 3 | P-10 | J-7 | 100 | Could not be resolved | — | — | — | — | 30.5 | 40 | B |
| Comparative Example 4 | P-10 | J-14 | 105 | Could not be resolved | — | — | — | — | 35.0 | 39 | B |

TABLE 6

Lithographic evaluation (developer: methyl n-pentyl ketone)

| | Resist underlayer film-forming composition | Radiation-sensitive resin composition | PEB temperature (° C.) | Contact hole evaluation | | | | | Line-and-space evaluation | | |
|---|---|---|---|---|---|---|---|---|---|---|---|
| | | | | Sensitivity (mJ/cm$^2$) | DOF (μm) | CDU (nm) | Minimum hole dimension (nm) | Pattern shape | Sensitivity (mJ/cm$^2$) | Minimum pre-collapse dimension (nm) | Pattern shape |
| Example 19 | P-10 | J-2 | 105 | 21.5 | 0.10 | 1.5 | 40 | A | 73.0 | 31 | A |
| Example 20 | P-10 | J-3 | 105 | 22.0 | 0.10 | 1.4 | 40 | A | 75.0 | 31 | A |
| Example 21 | P-10 | J-4 | 85 | 20.0 | 0.12 | 1.5 | 39 | A | 68.0 | 29 | A |
| Example 22 | P-10 | J-5 | 85 | 16.5 | 0.12 | 1.4 | 38 | A | 56.0 | 30 | A |
| Example 23 | P-10 | J-6 | 85 | 16.0 | 0.12 | 1.4 | 38 | A | 55.0 | 30 | A |
| Example 24 | P-10 | J-7 | 100 | 15.5 | 0.08 | 1.9 | 42 | A | 53.0 | 32 | A |
| Example 25 | P-1 | J-8 | 105 | 16.0 | 0.08 | 2.0 | 41 | A | 55.0 | 32 | A |
| Example 26 | P-10 | J-9 | 105 | 16.5 | 0.08 | 1.9 | 42 | A | 56.0 | 33 | A |
| Example 27 | P-16 | J-10 | 105 | 16.0 | 0.08 | 2.0 | 41 | A | 55.0 | 33 | A |
| Example 28 | P-16 | J-11 | 105 | 18.0 | 0.08 | 1.8 | 41 | A | 60.0 | 32 | A |
| Example 29 | P-10 | J-12 | 105 | 17.5 | 0.10 | 1.7 | 41 | A | 60.0 | 32 | A |
| Example 30 | P-10 | J-13 | 85 | 18.0 | 0.10 | 1.5 | 39 | A | 61.0 | 31 | A |
| Example 31 | P-10 | J-14 | 105 | 17.5 | 0.08 | 1.4 | 38 | A | 59.0 | 30 | A |
| Example 32 | P-1 | J-2 | 105 | 20.0 | 0.10 | 1.6 | 40 | A | 68.0 | 34 | A |
| Example 33 | P-1 | J-4 | 85 | 20.0 | 0.12 | 1.6 | 39 | A | 68.0 | 32 | A |
| Example 34 | P-1 | J-7 | 100 | 15.5 | 0.08 | 2.0 | 42 | A | 53.0 | 36 | A |
| Example 35 | P-1 | J-14 | 105 | 17.5 | 0.08 | 1.5 | 38 | A | 59.0 | 33 | A |
| Example 36 | P-16 | J-2 | 105 | 20.0 | 0.10 | 1.7 | 40 | A | 68.0 | 31 | A |
| Example 37 | P-16 | J-4 | 85 | 20.0 | 0.12 | 1.7 | 39 | A | 68.0 | 29 | A |
| Example 38 | P-16 | J-7 | 100 | 15.5 | 0.08 | 2.1 | 42 | A | 53.0 | 32 | A |
| Example 39 | P-16 | J-14 | 105 | 17.5 | 0.08 | 1.6 | 38 | A | 59.0 | 30 | A |

TABLE 7

Lithographic evaluation (developer: anisole)

| | Resist underlayer film-forming composition | Radiation-sensitive resin composition | PEB temperature (° C.) | Contact hole evaluation | | | | | Line-and-space evaluation | | |
|---|---|---|---|---|---|---|---|---|---|---|---|
| | | | | Sensitivity (mJ/cm$^2$) | DOF (μm) | CDU (nm) | Minimum hole dimension (nm) | Pattern shape | Sensitivity (mJ/cm$^2$) | Minimum pre-collapse dimension (nm) | Pattern shape |
| Example 19 | P-10 | J-2 | 105 | 17.5 | 0.10 | 1.6 | 42 | A | 60.0 | 34 | A |
| Example 20 | P-10 | J-3 | 105 | 18.0 | 0.10 | 1.5 | 42 | A | 61.0 | 35 | A |
| Example 21 | P-10 | J-4 | 85 | 16.5 | 0.12 | 1.6 | 41 | A | 55.0 | 32 | A |
| Example 22 | P-10 | J-5 | 85 | 13.5 | 0.12 | 1.5 | 40 | A | 45.0 | 33 | A |
| Example 23 | P-10 | J-6 | 85 | 13.0 | 0.12 | 1.5 | 40 | A | 45.0 | 33 | A |
| Example 24 | P-10 | J-7 | 100 | 12.5 | 0.08 | 2.0 | 45 | A | 43.0 | 36 | A |
| Example 25 | P-10 | J-8 | 105 | 13.0 | 0.08 | 2.1 | 44 | A | 43.0 | 36 | A |
| Example 26 | P-10 | J-9 | 105 | 13.5 | 0.08 | 2.0 | 45 | A | 46.0 | 37 | A |
| Example 27 | P-10 | J-10 | 105 | 13.0 | 0.08 | 2.1 | 44 | A | 45.0 | 37 | A |
| Example 28 | P-10 | J-11 | 105 | 14.5 | 0.08 | 1.9 | 44 | A | 49.0 | 36 | A |
| Example 29 | P-10 | J-12 | 105 | 14.0 | 0.10 | 1.8 | 44 | A | 48.0 | 36 | A |

TABLE 7-continued

| | | | | Lithographic evaluation (developer: anisole) | | | | | | | |
|---|---|---|---|---|---|---|---|---|---|---|---|
| | Resist | Radiation- | | Contact hole evaluation | | | | | Line-and-space evaluation | | |
| | underlayer film-forming composition | sensitive resin composition | PEB temperature (° C.) | Sensitivity (mJ/cm$^2$) | DOF (μm) | CDU (nm) | Minimum hole dimension (nm) | Pattern shape | Sensitivity (mJ/cm$^2$) | Minimum pre-collapse dimension (nm) | Pattern shape |
| Example 30 | P-10 | J-13 | 85 | 14.5 | 0.10 | 1.6 | 41 | A | 48.0 | 35 | A |
| Example 31 | P-10 | J-14 | 105 | 14.0 | 0.08 | 1.5 | 40 | A | 48.0 | 33 | A |
| Example 32 | P-1 | J-2 | 105 | 16.5 | 0.10 | 1.7 | 42 | A | 56.0 | 38 | A |
| Example 33 | P-1 | J-4 | 85 | 16.5 | 0.12 | 1.7 | 41 | A | 56.0 | 36 | A |
| Example 34 | P-1 | J-7 | 100 | 12.5 | 0.08 | 2.1 | 45 | A | 43.0 | 40 | A |
| Example 35 | P-1 | J-14 | 105 | 14.0 | 0.08 | 1.6 | 40 | A | 48.0 | 37 | A |
| Example 36 | P-16 | J-2 | 105 | 16.5 | 0.10 | 1.8 | 42 | A | 56.0 | 34 | A |
| Example 37 | P-16 | J-4 | 85 | 16.5 | 0.12 | 1.8 | 41 | A | 56.0 | 32 | A |
| Example 38 | P-16 | J-7 | 100 | 12.5 | 0.08 | 2.2 | 45 | A | 43.0 | 36 | A |
| Example 39 | P-16 | J-14 | 105 | 14.0 | 0.08 | 1.7 | 40 | A | 48.0 | 33 | A |

As is clear from the results shown in Tables 5 to 7, the resist pattern-forming method according to one embodiment of the invention could form a contact hole pattern and a line-and-space pattern that exhibited an excellent DOF, CDU, resolution, pattern collapse resistance, and pattern shape when using an ester, ketone, or ether organic solvent as the developer. A contact hole pattern could not be resolved when using an alkaline developer. The line-and-space pattern obtained using an alkaline developer exhibited poor pattern collapse resistance and a poor pattern shape as compared with the case where an organic solvent was used as the developer.

Formation of Contact Hole Pattern Utilizing a Plurality of Exposure Steps

Matching between the resist underlayer film-forming composition and the radiation-sensitive resin composition was evaluated when forming a contact hole pattern utilizing a plurality of exposure steps. A contact hole pattern was formed by the following method using each combination of the resist underlayer film-forming composition and the radiation-sensitive resin composition shown in Table 8. The results are shown in Table 8.

Examples 40 to 47

Formation of Contact Hole Pattern

A resist underlayer film and a resist film were formed in the same manner as in Examples 19 to 39. The resist film was exposed through a mask (40 nm line/80 nm pitch) using an ArF immersion scanner ("NSR-S610C" manufactured by Nikon Precision Inc.) (NA: 1.3, Dipole Y). In this case, the resist film was subjected to a first reduced projection exposure at a dose (sensitivity) at which a 40 nm line/80 nm pitch pattern was formed, and subjected to a second reduced projection exposure (NA: 1.3, Dipole X) at an identical dose so that the lines formed by the first reduced projection exposure intersected the lines formed by the second reduced projection exposure. The resist film was subjected to PEB at the temperature shown in Table 8 for 60 seconds on the hot plate of the coater/developer ("CLEAN TRACK Lithius Pro-i"), cooled (23° C., 30 seconds), subjected to puddle development (30 seconds) using n-butyl acetate as the developer, and rinsed (7 seconds) with MIBC. The wafer was spin-dried at 2000 rpm for 15 seconds to form a 40 nm hole/80 nm pitch resist pattern.

Evaluation

The DOF, the CDU, the minimum hole dimension, and the pattern shape were evaluated by the following methods using the contact hole pattern.

DOF

The DOF (pitch/hole size) was measured using the 40 nm hole/80 nm pitch resist pattern. The dimensions of the resist pattern were measured from above using a scanning electron microscope ("CG4000" manufactured by Hitachi High-Technologies Corporation). The DOF measurement results are shown in Table 8.

CDU

The 40 nm hole/80 nm pitch resist pattern was measured from above using a scanning electron microscope ("CG4000" manufactured by Hitachi High-Technologies Corporation). The hole diameter was measured at an arbitrary 24 points. The 3σ value that indicates the distribution of the measured values was calculated, and taken as the CDU. The results are shown in Table 8.

Minimum Hole Dimension

The resist film was subjected to reduced projection exposure through a pattern that was designed so that the pattern pitch after reduced projection exposure became 80 nm (diameter), and the minimum hole dimension was measured while increasing the dose to evaluate the resolution. The resolution measurement results are shown in Table 8.

Pattern Shape

The cross-sectional shape of a 40 nm hole/80 nm pitch resist pattern was observed using a scanning electron microscope ("S-4800" manufactured by Hitachi High-Technologies Corporation). The hole diameter Lb at the bottom of the resist pattern and the hole width La at the top of the resist pattern were measured. A case where "0.9≤(La/Lb)≤1.1" was satisfied was evaluated as "A", and a case where "0.9≤(La/Lb)≤1.1" was not satisfied was evaluated as "B". The pattern shape evaluation results are shown in Table 8.

When Using Another Developer

Each item was evaluated in the same manner as described above, except that methyl n-pentyl ketone or anisole was used as the developer instead of butyl acetate. The evaluation results obtained when using methyl n-pentyl ketone as the developer are shown in Table 9, and the evaluation results obtained when using anisole as the developer are shown in Table 10.

TABLE 8

| | Resist underlayer film-forming composition | Radiation-sensitive resin composition | PEB temperature (°C.) | Lithographic evaluation (developer: butyl acetate) Contact hole evaluation | | | | |
|---|---|---|---|---|---|---|---|---|
| | | | | Sensitivity (mJ/cm$^2$) | DOF (μm) | CDU (nm) | Minimum hole dimension (nm) | Pattern shape |
| Example 40 | P-10 | J-3 | 105 | 32.5 | 0.1 | 1.4 | 38 | A |
| Example 41 | P-10 | J-5 | 85 | 27.5 | 0.1 | 1.2 | 36 | A |
| Example 42 | P-10 | J-7 | 100 | 26.0 | 0.1 | 1.5 | 40 | A |
| Example 43 | P-10 | J-9 | 105 | 27.5 | 0.1 | 1.5 | 40 | A |
| Example 44 | P-10 | J-13 | 85 | 29.0 | 0.1 | 1.4 | 38 | A |
| Example 45 | P-10 | J-14 | 105 | 30.0 | 0.1 | 1.1 | 36 | A |
| Example 46 | P-1 | J-3 | 105 | 33.0 | 0.1 | 1.5 | 40 | A |
| Example 47 | P-16 | J-3 | 105 | 32.5 | 0.1 | 1.4 | 39 | A |

TABLE 9

| | Resist underlayer film-forming composition | Radiation-sensitive resin composition | PEB temperature (°C.) | Lithographic evaluation (methyl n-pentyl ketone) Contact hole evaluation | | | | |
|---|---|---|---|---|---|---|---|---|
| | | | | Sensitivity (mJ/cm$^2$) | DOF (μm) | CDU (nm) | Minimum hole dimension (nm) | Pattern shape |
| Example 40 | P-10 | J-3 | 105 | 52.0 | 0.1 | 1.3 | 34 | A |
| Example 41 | P-10 | J-5 | 85 | 43.0 | 0.1 | 1.1 | 32 | A |
| Example 42 | P-10 | J-7 | 100 | 41.0 | 0.1 | 1.4 | 36 | A |
| Example 43 | P-10 | J-9 | 105 | 43.0 | 0.1 | 1.4 | 36 | A |
| Example 44 | P-10 | J-13 | 85 | 47.0 | 0.1 | 1.3 | 34 | A |
| Example 45 | P-10 | J-14 | 105 | 45.0 | 0.1 | 1.0 | 32 | A |
| Example 46 | P-1 | J-3 | 105 | 52.5 | 0.1 | 1.4 | 36 | A |
| Example 47 | P-16 | J-3 | 105 | 52.0 | 0.1 | 1.3 | 35 | A |

TABLE 10

| | Resist underlayer film-forming composition | Radiation-sensitive resin composition | PEB temperature (°C.) | Lithographic evaluation (developer: anisole) Contact hole evaluation | | | | |
|---|---|---|---|---|---|---|---|---|
| | | | | Sensitivity (mJ/cm$^2$) | DOF (μm) | CDU (nm) | Minimum hole dimension (nm) | Pattern shape |
| Example 40 | P-10 | J-3 | 105 | 43.0 | 0.1 | 1.3 | 36 | A |
| Example 41 | P-10 | J-5 | 85 | 34.5 | 0.1 | 1.1 | 34 | A |
| Example 42 | P-10 | J-7 | 100 | 33.0 | 0.1 | 1.4 | 38 | A |
| Example 43 | P-10 | J-9 | 105 | 35.0 | 0.1 | 1.4 | 38 | A |
| Example 44 | P-10 | J-13 | 85 | 37.0 | 0.1 | 1.3 | 36 | A |
| Example 45 | P-10 | J-14 | 105 | 37.0 | 0.1 | 1.0 | 34 | A |
| Example 46 | P-1 | J-3 | 105 | 43.5 | 0.1 | 1.4 | 38 | A |
| Example 47 | P-16 | J-3 | 105 | 43.0 | 0.1 | 1.3 | 37 | A |

As is clear from the results shown in Tables 8 to 10, the resist pattern-forming method according to one embodiment of the invention could form a contact hole pattern that exhibited an excellent DOF, CDU, resolution, and pattern shape when using an ester, ketone, or ether organic solvent as the developer when performing a plurality of exposure steps.

The resist pattern-forming method according to the embodiments of the invention can thus deal with various resist patterns (e.g., trench pattern and hole pattern), and can form a resist pattern that exhibits an excellent depth of focus, an excellent pattern shape, high resolution, excellent CDU, excellent pattern collapse resistance, and the like. Therefore, the resist pattern-forming method may suitably be used for lithography for which a reduction in line width will be increasingly desired in the future.

Obviously, numerous modifications and variations of the invention are possible in light of the above teachings. It is therefore to be understood that within the scope of the appended claims, the invention may be practiced otherwise than as specifically described herein.

What is claimed is:

1. A resist pattern-forming method comprising:
   applying a resist underlayer film-forming composition to a substrate to form a resist underlayer film, the resist underlayer film-forming composition including (A) a polysiloxane;
   applying a radiation-sensitive resin composition to the resist underlayer film to form a resist film, the radiation-sensitive resin composition including (a1) a polymer that changes in polarity and decreases in solubility in an organic solvent due to an acid;
   exposing the resist film; and
   developing the exposed resist film using a developer that includes an organic solvent, wherein the polysiloxane (A) is a hydrolysis-condensation product of a silane compound shown by a formula (i), $$R^A{}_a SiX_{4-a} \tag{i}$$

wherein $R^A$ represents a hydrogen atom, a fluorine atom, an alkyl group having 1 to 5 carbon atoms, an alkenyl group, an aryl group, or a cyano group; the alkyl group represented by $R^A$ is unsubstituted, or at least one hydrogen atom of the alkyl group represented by $R^A$ is substituted with a glycidyloxy group, an oxetanyl group, an acid anhydride group, or a cyano group; the aryl group represented by $R^A$ is unsubstituted, or at least one hydrogen atom of the aryl group represented by $R^A$ is substituted with a hydroxyl group; X represents a halogen atom or —$OR^B$, wherein $R^B$ represents a monovalent organic group; a is an integer from 0 to 3;

in a case where a plurality of $R^A$ are present, each of the plurality of $R^A$ is either identical or different; and in a case where plurality of X are present, each of the plurality of X is either identical or different.

2. The resist pattern-forming method according to claim 1, wherein the resist underlayer film-forming composition further includes (B) a nitrogen-containing compound.

3. The resist pattern-forming method according to claim 1, wherein the resist underlayer film-forming composition further includes (C) a photoacid generator.

4. The resist pattern-forming method according to claim 1, wherein the polymer (a1) includes a structural unit (I) shown by a formula (1),

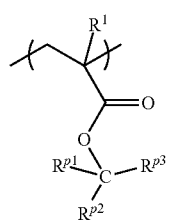

(1)

wherein R represents a hydrogen atom or a methyl group; and each of $R^{p1}$, $R^{p2}$, and $R^{p3}$ individually represents a monovalent hydrocarbon group having 1 to 20 carbon atoms; or $R^{p1}$ represents a monovalent hydrocarbon group having 1 to 20 carbon atoms, and $R^{p2}$ and $R^{p3}$ bond to each other to form a divalent alicyclic hydrocarbon group having 4 to 20 carbon atoms together with a carbon atom bonded to $R^{p2}$ and $R^{p3}$.

5. The resist pattern-forming method according to claim 1, wherein the radiation-sensitive resin composition further includes (a2) a polymer that includes a structural unit shown by a formula (3-1), a structural unit shown by a formula (3-2) or both thereof,

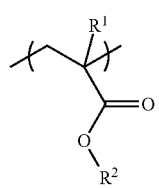

(3-1)

wherein $R^1$ represents a hydrogen atom, a methyl group, or a trifluoromethyl group, and $R^2$ represents a linear or branched alkyl group having 1 to 6 carbon atoms that includes a fluorine atom, or a monovalent alicyclic group having 4 to 20 carbon atoms that includes a fluorine atom, wherein the alkyl group represented by $R^2$ is unsubstituted or at least one hydrogen atom of the alkyl group represented by $R^2$ is substituted with a substituent, and wherein the alicyclic hydrocarbon group represented by $R^2$ is unsubstituted or at least one hydrogen atom of the alicyclic hydrocarbon group represented by $R^2$ is substituted with a substituent,

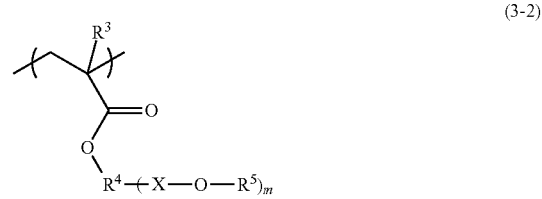

(3-2)

wherein $R^3$ represents a hydrogen atom, a methyl group, or a trifluoromethyl group, $R^4$ represents an (m+1)-valent linking group, m is an integer from 1 to 3, X represents a divalent linking group that includes a fluorine atom, and $R^5$ represents a hydrogen atom or a monovalent organic group, and wherein, in a case where m is 2 or 3, each of a plurality of X is either identical or different and each of a plurality of $R^5$ is either identical or different.

6. The resist pattern-forming method according to claim 5, wherein the polymer (a2) does not include an acid-labile group.

7. The resist pattern-forming method according claim 1, the resist pattern-forming method being used to form a trench pattern, a hole pattern or both thereof.

8. A resist pattern-forming method comprising:
applying a resist underlayer film-forming composition to a substrate to form a resist underlayer film, the resist underlayer film-forming composition including (A) a polysiloxane consisting essentially of siloxane repeat units;
applying a radiation-sensitive resin composition to the resist underlayer film to form a resist film, the radiation-sensitive resin composition including (a1) a polymer that changes in polarity and decreases in solubility in an organic solvent due to an acid;
exposing the resist film; and
developing the exposed resist film using a developer that includes an organic solvent.

9. The resist pattern-forming method according to claim 8, wherein the polysiloxane (A) is a hydrolysis-condensation product of a silane compound shown by a formula (i), $$R^A_a SiX_{4-a}$$ (i)

wherein $R^A$ represents a hydrogen atom, a fluorine atom, an alkyl group having 1 to 5 carbon atoms, an alkenyl group, an aryl group, or a cyano group; the alkyl group represented by $R^A$ is unsubstituted, or at least one hydrogen atom of the alkyl group represented by $R^A$ is substituted with a glycidyloxy group, an oxetanyl group, an acid anhydride group, or a cyano group; the aryl group represented by $R^A$ is unsubstituted, or at least one hydrogen atom of the aryl group represented by $R^A$ is substituted with a hydroxyl group; X represents a halogen atom or —$OR^B$, wherein $R^B$ represents a monovalent organic group; a is an integer from 0 to 3;

in a case where a plurality of $R^A$ are present, each of the plurality of $R^A$ is either identical or different; and in a case where plurality of X are present, each of the plurality of X is either identical or different.

* * * * *